US009478284B2

(12) United States Patent
Sasago et al.

(10) Patent No.: US 9,478,284 B2
(45) Date of Patent: Oct. 25, 2016

(54) SEMICONDUCTOR STORAGE DEVICE

(71) Applicant: Hitachi, Ltd., Chiyoda-ku, Tokyo (JP)

(72) Inventors: Yoshitaka Sasago, Tokyo (JP); Hiroyuki Minemura, Tokyo (JP); Kenzo Kurotsuchi, Tokyo (JP); Seiji Miura, Tokyo (JP); Satoru Hanzawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/783,846

(22) PCT Filed: May 20, 2013

(86) PCT No.: PCT/JP2013/063933
§ 371 (c)(1),
(2) Date: Oct. 9, 2015

(87) PCT Pub. No.: WO2014/188484
PCT Pub. Date: Nov. 27, 2014

(65) Prior Publication Data
US 2016/0078932 A1    Mar. 17, 2016

(51) Int. Cl.
*G11C 13/00* (2006.01)
*H01L 45/00* (2006.01)
*H01L 27/24* (2006.01)

(52) U.S. Cl.
CPC ......... *G11C 13/004* (2013.01); *G11C 13/0004* (2013.01); *G11C 13/0069* (2013.01); *G11C 13/0097* (2013.01); *H01L 27/249* (2013.01); *H01L 27/2436* (2013.01); *H01L 45/06* (2013.01); *H01L 45/1226* (2013.01); *G11C 2213/71* (2013.01); *G11C 2213/75* (2013.01); *G11C 2213/79* (2013.01)

(58) Field of Classification Search
CPC ................. G11C 13/0004; G11C 2213/79
USPC ...................................................... 365/163
See application file for complete search history.

(56) References Cited

U.S. PATENT DOCUMENTS

| 8,169,819 B2 * | 5/2012 | Shima | H01L 45/1683 257/278 |
| 8,730,717 B2 * | 5/2014 | Hanzawa | G11C 13/0004 365/100 |
| 8,866,123 B2 * | 10/2014 | Sasago | H01L 45/1608 257/2 |

(Continued)

FOREIGN PATENT DOCUMENTS

| JP | 2008-160004 A | 7/2008 |
| WO | WO 2011/074545 A1 | 6/2011 |

(Continued)

*Primary Examiner* — Son Mai
(74) *Attorney, Agent, or Firm* — Miles & Stockbridge P.C.

(57) ABSTRACT

An object of this invention is to provide a semiconductor memory device capable of increasing the read transfer rate by performing the read operation in parallel while suppressing the voltage drop when a large current is passed to a memory chain and reducing a chip area by reducing the number of peripheral circuits to feed power. A semiconductor memory device according to this invention includes upper and lower electrodes in a flat plate shape, first and second select transistors extending in first and second directions respectively, and a wire arranged between the first select transistor and the second select transistor and the wire and the lower electrode are configured to be electrically insulated from each other by turning off the first select transistor (see FIG. 2).

15 Claims, 23 Drawing Sheets

(56) References Cited

U.S. PATENT DOCUMENTS

| | | | |
|---|---|---|---|
| 9,099,177 B2 * | 8/2015 | Sasago | H01L 27/2454 |
| 2008/0149913 A1 * | 6/2008 | Tanaka | H01L 27/2454 257/5 |
| 2012/0248399 A1 | 10/2012 | Sasago et al. | |
| 2013/0141968 A1 | 6/2013 | Sasago et al. | |
| 2014/0218999 A1 | 8/2014 | Sasago et al. | |
| 2014/0246646 A1 | 9/2014 | Sasago et al. | |
| 2015/0097155 A1 * | 4/2015 | Bateman | H01L 27/2454 257/5 |
| 2015/0155479 A1 | 6/2015 | Sasago | |

FOREIGN PATENT DOCUMENTS

| | | |
|---|---|---|
| WO | WO 2012/032730 A1 | 3/2012 |
| WO | WO 2012/168981 A1 | 12/2012 |
| WO | WO 2013/051066 A1 | 4/2013 |
| WO | WO 2013/183101 A1 | 12/2013 |

* cited by examiner

READ OPERATION

VERIFY OPERATION

RESET OPERATION

FIG. 9
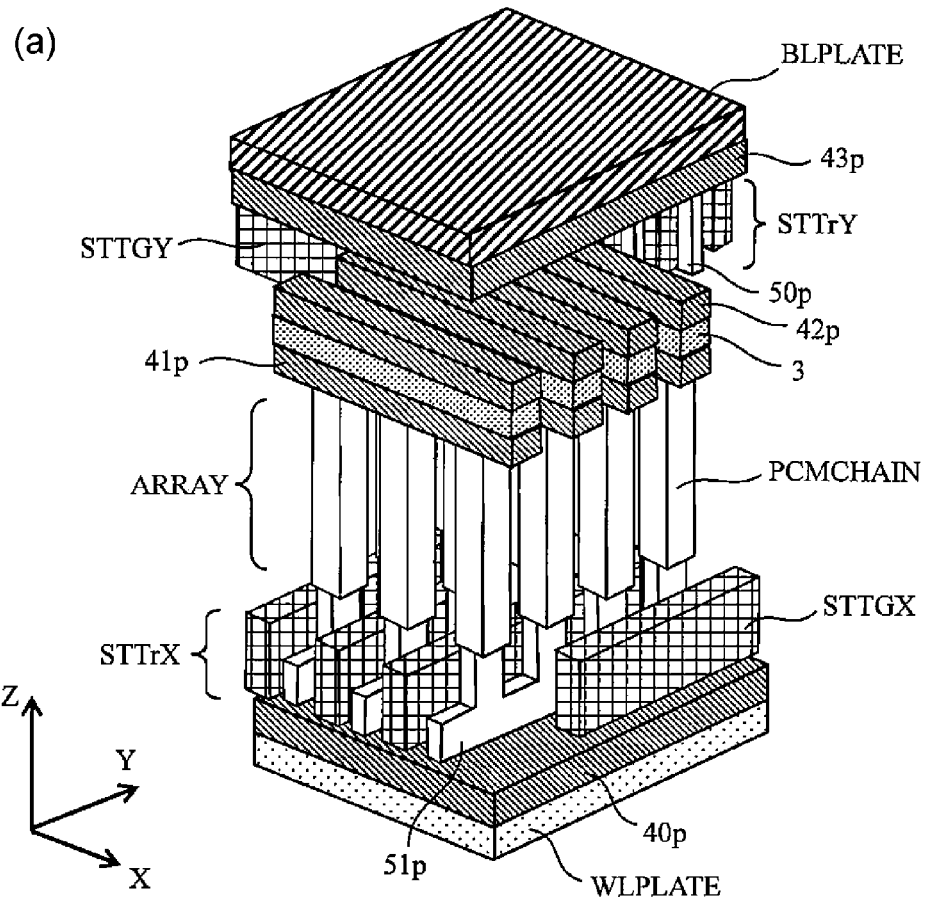
(a)
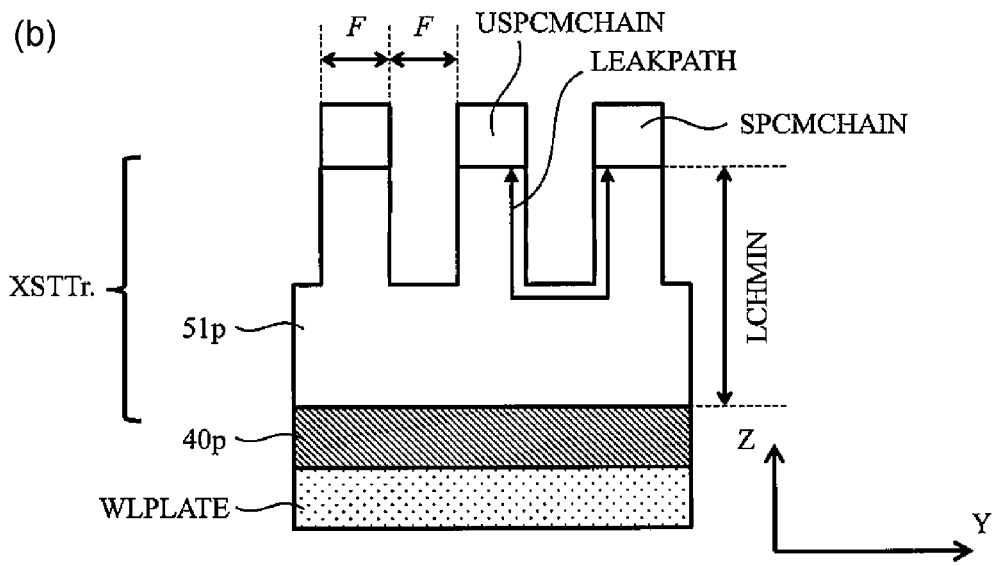
(b)

FIG. 13
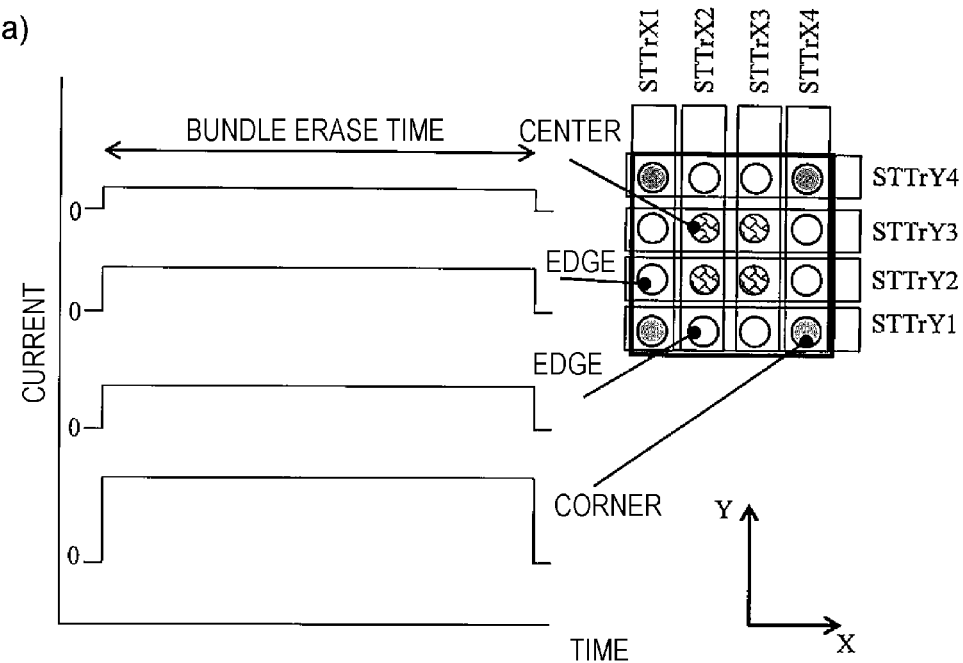
(a)
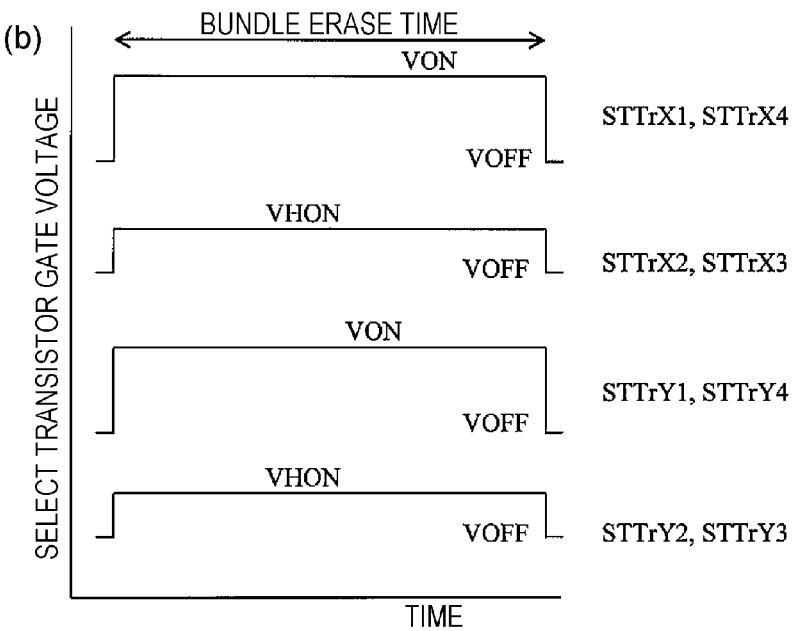
(b)

FIG. 15
(a)
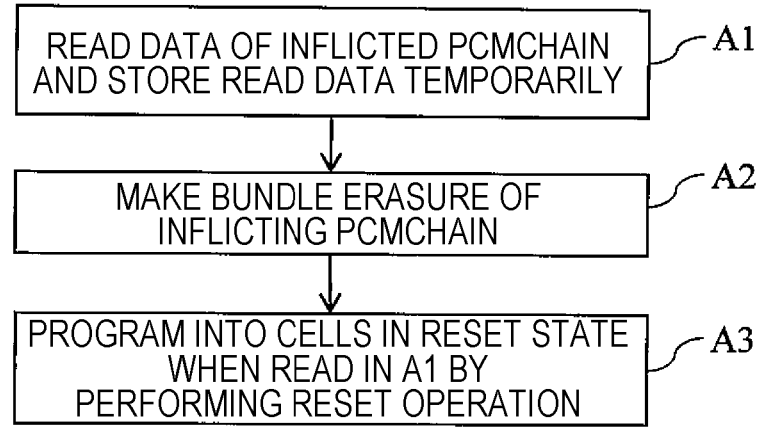
(b)
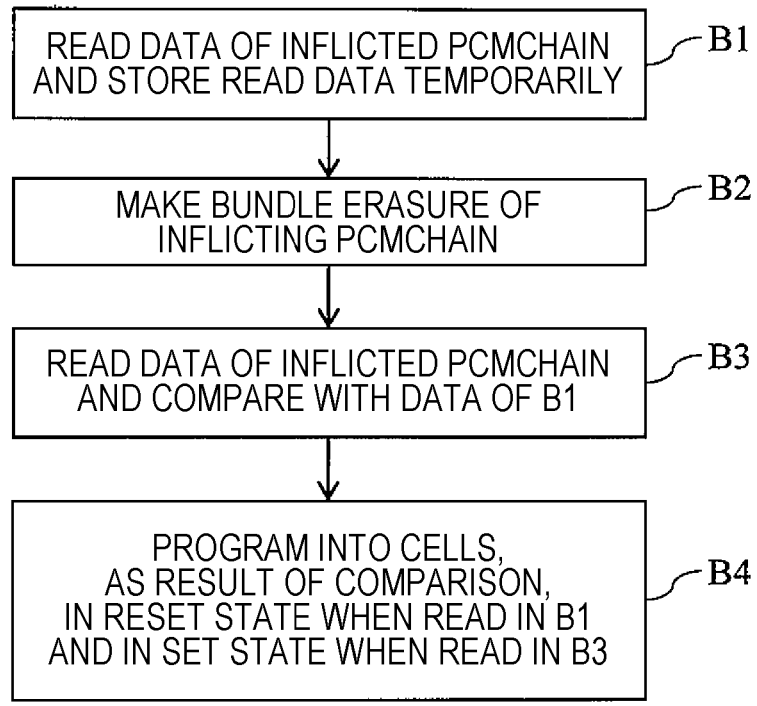

SEMICONDUCTOR STORAGE DEVICE

TECHNICAL FIELD

This invention relates to a semiconductor memory device.

BACKGROUND ART

In recent years, a phase change memory using chalcogenide as a recording medium has been actively studied. The phase change memory is a kind of resistance change type memory that stores information by using the fact that the recording material between electrodes has a different resistive state.

The phase change memory stores information by using the fact that the resistivity of a phase change material such as $Ge_2Sb_2Te_5$ is different between an amorphous state and a crystalline state. The resistance is higher in the amorphous state and lower in the crystalline state. Thus, information can be read from a memory cell by providing a voltage difference between both ends of an element, measuring a current flowing through the element, and determining a high resistive state/low resistive state of the element.

In the phase change memory, data is programmed/erased by changing electric resistance of a phase change film to different states by Joule heat generated by the current flowing through a phase change element. A reset operation, that is, an operation to change the phase change element to an amorphous state of higher resistance is performed by passing a large current for a short period to melt a phase change material and then rapidly reducing the current for cooling. On the other hand, a set operation, that is, an operation to change the phase change element to a crystalline state of lower resistance is performed by passing a current sufficient to retain the phase change material at temperature of crystallization for a long time. The phase change memory needs a smaller current to change the state of phase change film with a reducing memory cell size, which makes the phase change memory suitable in principle for the reduction of memory cell size. Therefore, the research thereof has been actively conducted.

PTL 1 below discloses, as a method of integrating a phase change memory, a configuration in which a plurality of through holes passing through all layers is formed by single patterning in a stacked structure in which a plurality of gate electrode materials and a plurality of insulator films are alternately stacked and a gate insulator film, a channel layer, and a phase change film are formed inside the through hole. An individual memory cell includes a cell transistor and a phase change element connected in parallel and a plurality of memory cells is connected in series in a vertical direction, that is, a normal direction of the semiconductor substrate to form a phase change memory chain. In an array configuration in PTL 1, an individual phase change memory chain is selected by a vertical type select transistor. A channel semiconductor layer of each select transistor has a structure isolated for each phase change memory chain.

A phase change memory can perform a reset operation at high speed due to features of the aforementioned set operation and reset operation, but compared therewith, a set operation is slower. As a technology to compensate for a challenge of slow speed of a set operation of the phase change memory, PTL 2 describes a method of performing a simultaneous set operation for a plurality of phase change memory chains that are physically adjacent to each other.

PTL 3 describes a configuration example that has a structure that makes it easier to drive a large current used for performing a reset operation by forming both of upper and lower electrodes of a chain cell into a plate shape and selects the chain by using multi-stage select transistors orthogonal to each other in a main surface of the semiconductor substrate.

CITATION LIST

Patent Literature

PTL 1: JP 2008-160004 A
PTL 2: WO 2012/032730 A1
PTL 3: WO 2012/168981 A1

SUMMARY OF INVENTION

Technical Problem

In a semiconductor memory device described in PTL 1, 2, at least one of wires connected to both ends of a phase change memory chain is formed from a plurality of wires as thin as pitches of memory cells. A reset operation is fast, but current consumption is large in a phase change memory and thus, it is not desirable to use a thin metal wire portion due to a larger voltage drop. Also, it is necessary for each peripheral circuit that feeds power to a plurality of metal wires to drive a large current needed for a reset operation and thus, the ratio of an area of the circuit that feeds power to each wire to a chip area increases, leading to an increased bit cost. Though not as large a current as that for a reset operation, a large current is also needed for a set operation and a total current needed for performing a simultaneous set operation for a plurality of chains described in PTL 2 exceeds a reset current of a single cell. Thus, it is desirable to supply a current by using a wire as thick as possible for the reset operation and the set operation. From the above viewpoint, therefore, configuring upper and lower electrodes of a memory chain in a plate shape as described in PTL 3 is considered to be preferable.

In PTL 3, the upper and lower electrodes of a memory chain have a plate shape and select transistors that select a memory chain in each of the XY directions are arranged by stretching in each of the XY directions. By selecting one or more memory chains in each of the XY directions and passing a current, information can be programmed into memory cells contained in the selected memory chains in parallel. At this point, there is no need to read the value of current flowing through the memory chain.

On the other hand, when information is read in PTL 3, it is necessary, as described above, to read a current flowing through the memory chain. If, at this point, a plurality of memory chains is selected in each of the XY directions, each select transistor is connected in parallel by a plate electrode and thus, it is impossible to distinguish from which memory chain a current flowing therethrough is read. In PTL 3, therefore, only one memory chain in a memory matrix can simultaneously be selected during read operation. That is, even if the read operation can be performed using a smaller current when compared with a reset operation or a set operation, the degree of parallelism cannot be increased, leading to a lower read transfer rate.

This invention is made in view of the above circumstances and an object thereof is to provide a semiconductor memory device capable of increasing the read transfer rate by performing the read operation in parallel while suppressing the voltage drop when a large current is passed to a memory chain and reducing a chip area by reducing the number of peripheral circuits to feed power.

Solution to Problem

A semiconductor memory device according to this invention includes upper and lower electrodes in a flat plate shape, first and second select transistors extending in first and second directions respectively, and a wire arranged between the first select transistor and the second select transistor and the wire and the lower electrode are configured to be electrically insulated from each other by turning off the first select transistor.

Advantageous Effects of Invention

According to a semiconductor memory device according to this invention, a memory cell array can be made denser and also read performance can be enhanced.

Other challenges, configurations, and effects than those described above will be made apparent by the description of embodiments described below.

BRIEF DESCRIPTION OF DRAWINGS

FIGS. 9(a) and 9(b) are diagrams showing a modification of the structure of the PCMCHAIN array illustrated with reference to FIGS. 1 to 4.

FIGS. 13(a) and 13(b) are diagrams illustrating a second technique to adjust the heating value in the bundle erase unit.

FIGS. 15(a) and 15(b) are operation flows when the semiconductor memory device according to a fourth embodiment performs bundle erasing.

DESCRIPTION OF EMBODIMENTS

Hereinafter, the embodiments of this invention will be described in detail based on the drawings. In all diagrams illustrating the embodiments, the same reference signs are attached to members having the same function to omit a repeated description thereof. Portions describing characteristic configurations are not limited to each embodiment and it should be noted in advance that if such a characteristic configuration is a common configuration, a similar effect can be obtained.

First Embodiment

Figure 1:
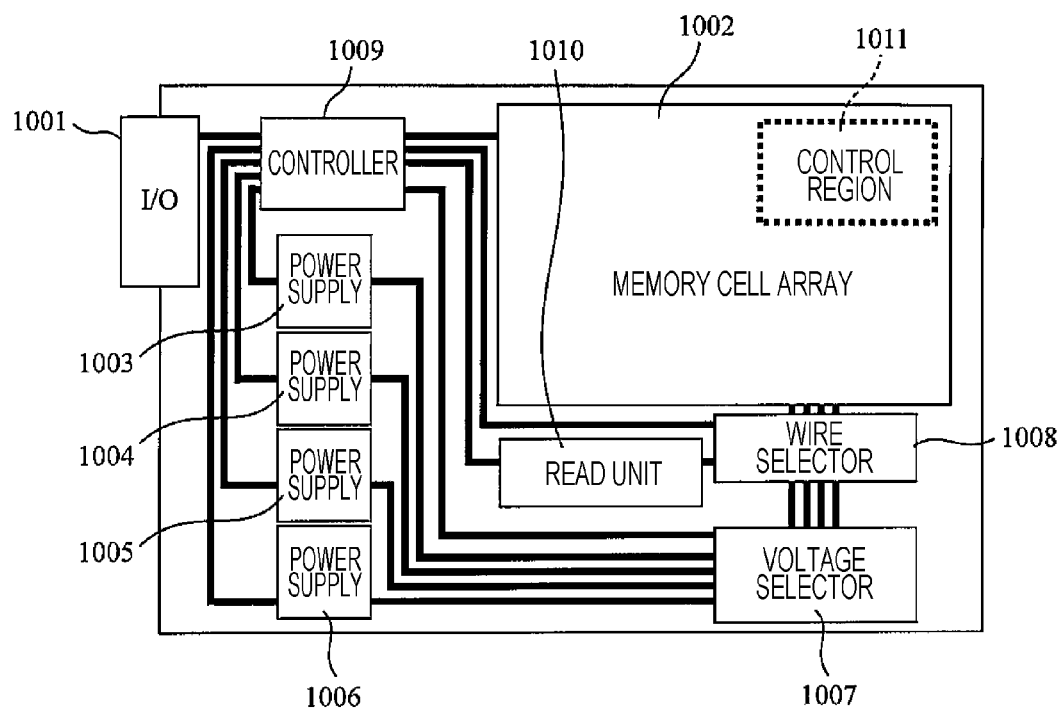
FIG. 1 is a function block diagram of a semiconductor memory device according to a first embodiment.

FIG. 1 is a function block diagram of a semiconductor memory device according to the first embodiment of this invention. The semiconductor memory device according to the first embodiment includes an I/O interface 1001, a memory cell array 1002, voltage sources 1003 to 1006, a voltage selector 1007, a wire selector 1008, and a controller 1009. The wire selector 1008 includes a read unit 1010 having a sense amplifier and the like. The I/O interface 1001 includes an input/output buffer to exchange data with the outside of the semiconductor memory device. The voltage sources 1003 to 1006 supply voltages different from each other. The voltage selector 1007 selects the voltage supplied by the voltage sources 1003 to 1006. The wire selector 1008 selects the output destination of the voltage selector 1007 from wires of the memory cell array 1002 such as bit lines and word lines. The controller 1009 controls an overall operation of the semiconductor memory device. A control region 1011 for recording various kinds of information of the semiconductor memory device is provided inside the memory cell array 1002.

When data is input into the I/O interface 1001 from an external device, the controller 1009 selects the voltage for data programming by the voltage selector 1007, generates a voltage pulse by the power supplies 1003 to 1006, and supplies the voltage pulse to a predetermined wire of the memory cell array 1002 by the wire selector 1008. Accordingly, the input data is programmed into a phase change memory cell of the memory cell array.

When a data read signal is input into the I/O interface 1001 from an external device, the controller 1009 selects the voltage for data read by the voltage selector 1007, generates a voltage pulse by the power supplies 1003 to 1006, and supplies the voltage pulse to a predetermined wire of the memory cell array 1002 by the wire selector 1008. By supplying the voltage pulse, the read current is read by the read unit 1010 and this becomes a read result of the stored data and is output to the external device through the controller 1009 and the I/O interface 1001.

The controller 1009 can be configured by using hardware such as a circuit device realizing the function thereof or by software realizing the function thereof being executed by an arithmetic unit such as a central processing unit (CPU).

Figure 2:
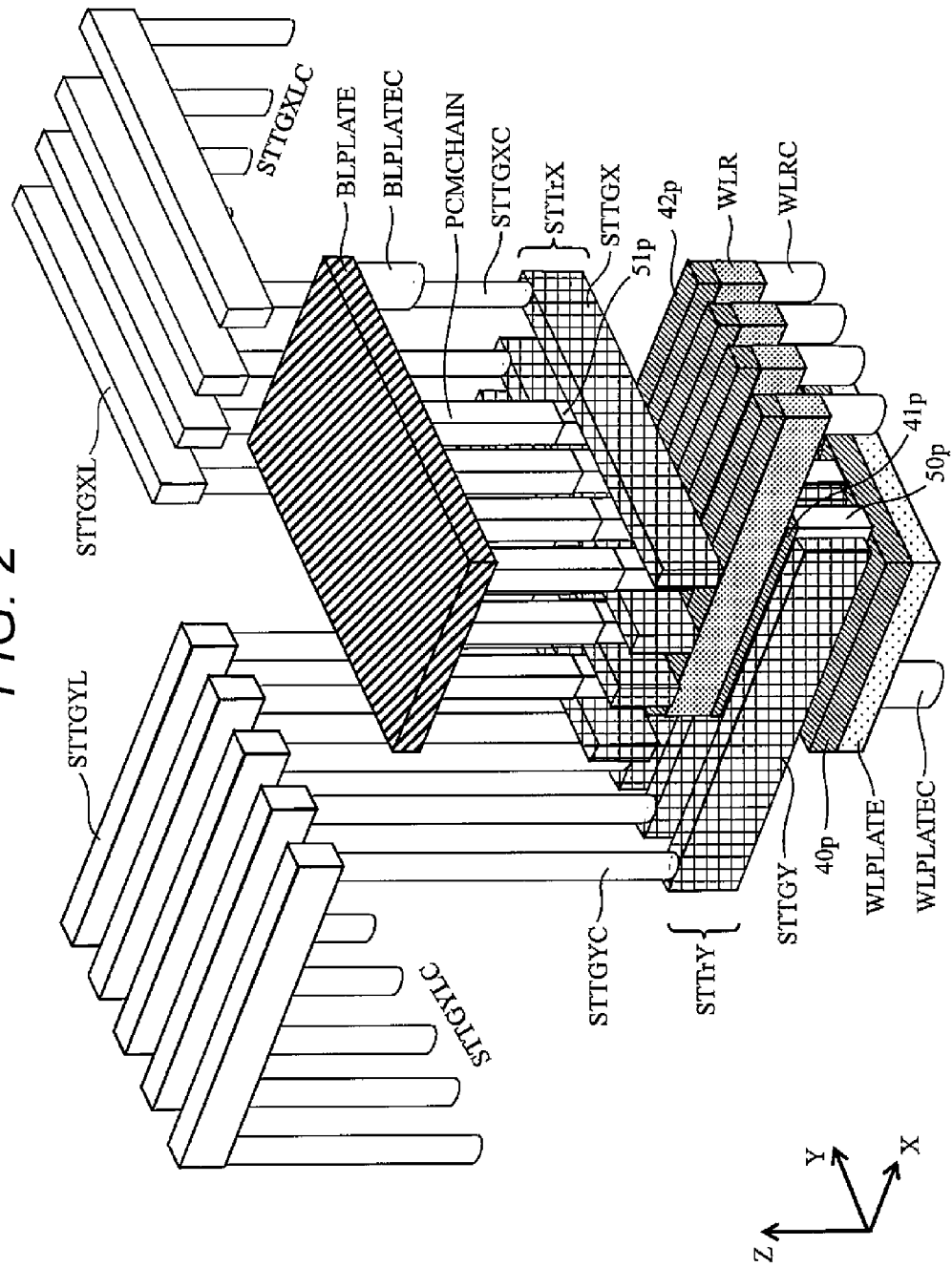
FIG. 2 is a three-dimensional schematic diagram showing the configuration of a memory cell array portion of the semiconductor memory device according to the first embodiment.

FIG. 2 is a three-dimensional schematic diagram showing the configuration of a memory cell array portion of the semiconductor memory device according to the first embodiment. In FIG. 2, electrodes BLPLATE, WLPLATE in a plate shape, WLR (corresponding to an electrode 3 described later) extending in the X direction, a phase change memory chain cell PCMCHAIN, an X select transistor STTrX extending in the Y direction to select PCMCHAIN in the X direction, and an X select transistor STTrY extending in the X direction to select PCMCHAIN in the Y direction. Gates of STTrX and STTrY are STTGX and STTGY respectively.

FIG. 2 further shows BLPLATEC connecting BLPLATE and a circuit on the semiconductor substrate, WLPLATEC connecting WLPLATE and a circuit on the semiconductor substrate, a contact STTGXC leading to STTGX, a wire STTGXL to feed power to STTGX through STTGXC, STTGXLC connecting STTGXL and a circuit on the semiconductor substrate, a contact STTGYC leading to STTGY, a wire STTGYL to feed power to STTGY through STTGYC, and STTGYLC connecting STTGYL and a circuit on the semiconductor substrate.

Figure 3:
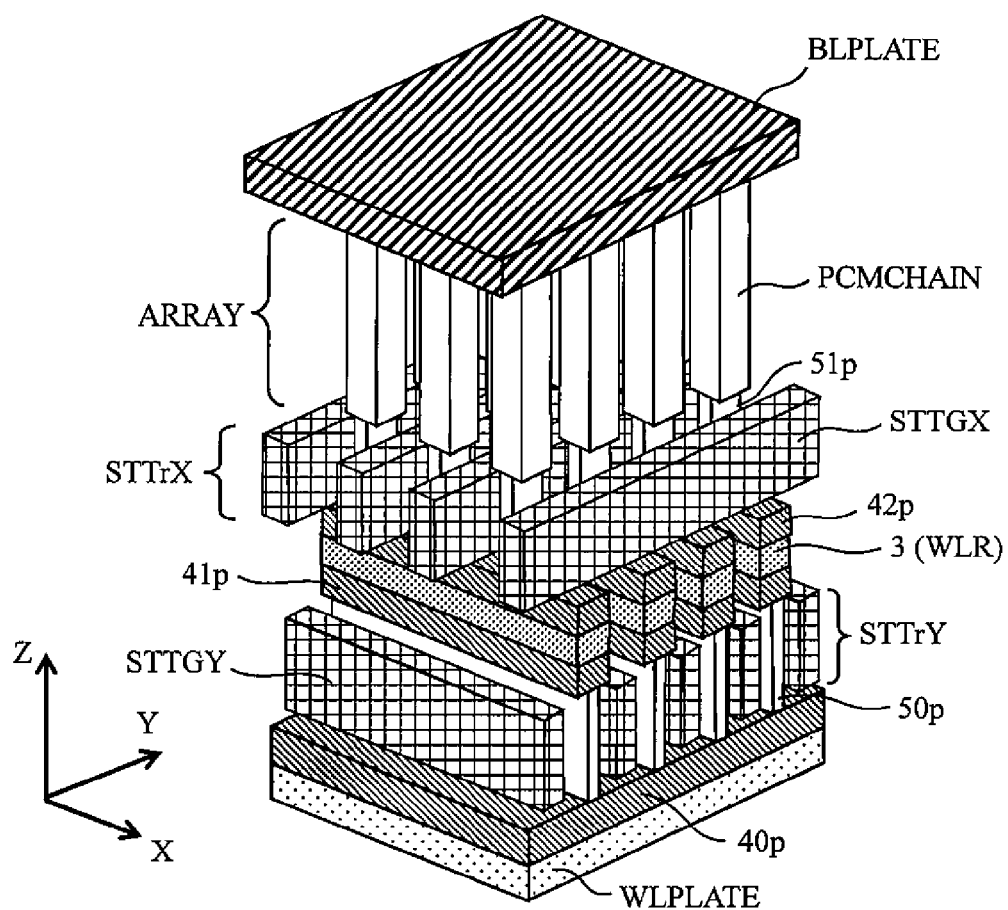
FIG. 3 is a diagram extracting and showing an array of PCMCHAIN and upper and lower portions thereof in FIG. 2.

FIG. 3 is a diagram extracting and showing an array of PCMCHAIN and upper and lower portions thereof in FIG. 2. The electrode 3 extends in the X direction and operates as a word line WLR that selects PCMCHAIN in the Y direction during read operation. The X select transistor STTrX is formed above the electrode 3. The gate STTGX of STTrX extends in the Y direction perpendicular to the electrode 3 and a channel semiconductor layer 51*p* is formed in a space between gates via a gate insulator film 20 (shown in FIG. 4 described later). The channel semiconductor layer 51*p* is connected to the electrode 3 via an N type semiconductor layer 42*p*. An upper portion of the channel semiconductor layer 51*p* is connected to a channel semiconductor layer 8*p* forming PCMCHAIN. The channel semiconductor layer 51*p* is separated in the X direction and the Y direction for each PCMCHAIN. PCMCHAIN is formed above STTrX. Details of PCMCHAIN will be described again with reference to FIG. 4 described later.

The Y select transistor STTrY is formed paired with the electrode 3 below the electrode 3. The gate STTGY of STTrY extends in the X direction parallel to the electrode 3 and a channel semiconductor layer 50*p* is formed in a space between gates via the gate insulator film. An upper portion of the channel semiconductor layer 50*p* is connected to the electrode 3 via an N type semiconductor layer 41*p*. A lower portion of the channel semiconductor layer 50*p* is connected to the plate electrode WLPLATE via an N type semiconductor layer 40*p*. The source/drain diffusion layer of the channel semiconductor layer 50*p* is made of the N type semiconductor layers 40*p*, 41*p* and thus, the length of the channel semiconductor layer 50*p* in the X direction becomes the channel width of STTrY. STTrY can drive a larger ON current with an increasing channel width. The channel semiconductor layer 50*p* may be separated in the X direction at suitable intervals by the lower portion of the electrode 3 in accordance with a necessary ON current.

In FIG. 3, the electrode 3 extending in the X direction, the gate electrode STTGY of STTrY extending in the X direction, and the gate electrode STTGX of STTrX extending in the Y direction can be formed with 2F pitches when the minimum feature size is F. That is, a memory cell of a projection area of $4F^2$ in the XY plane can be formed.

A supplementary description of the structure of the select transistors STTrX, STTrY will be provided. Focusing on STTrY, the channel semiconductor layer 50*p* is formed on the sidewall via the gate insulator film of the gates STTGY extending in the X direction and arranged in the Y direction with 2F pitches. Focusing on the one channel semiconductor layer 50*p*, both sides thereof in the Y direction are in contact with STTGY via the gate insulator film. Focusing on one STTGY, both sides thereof in the Y direction are in contact with the channel semiconductor layer 50*p* via the gate insulator film.

If the thickness in the Y direction of the channel semiconductor layer 50*p* of the Y select transistor STTrY is thick (about 10 nm or more for silicon), an independent inversion layer is formed in each of two STTGY in contact with the channel semiconductor layer via the gate insulator film. As a result, if an ON voltage is biased to one of two gates or both gates, the channel semiconductor layer 50*p* is changed to an ON state to allow conduction between the plate electrode WLPLATE and the electrode 3.

If an OFF voltage is biased to both gates, the channel semiconductor layer 50*p* is changed to an OFF state to insulate between the plate electrode WLPLATE and the electrode 3. In this case, if the ON voltage is biased to one STTGY, the two channel semiconductor layers 50*p* on both sides thereof are always changed to the ON state and thus, it seems to be impossible to change only the one channel semiconductor layer 50*p* to the ON state. However, if the channel semiconductor layer 50*p* is sufficiently thin (about 10 nm or less for silicon), even if the ON voltage is biased to one of STTGY on both sides, the other STTGY can be changed to the OFF state by a strong OFF voltage (negative voltage relative to the source voltage for NMOS) being biased thereto. This is because a depletion layer totally spreads in the thickness direction of the channel semiconductor layer 50*p* and the carrier density of the inversion layer on the back side of the channel semiconductor layer 50*p* is suppressed by an electric field from one STTGY.

Therefore, even if the ON voltage is biased to one STTGY, the channel semiconductor layers 50*p* on both sides thereof are not always changed to the ON state and the other STTGY can be changed to the OFF state by biasing a strong OFF voltage via the gate insulator film 10. Using this phenomenon, only one channel semiconductor layer can be selected and changed to the ON state. Also, a plurality of the channel semiconductor layers 50*p* arranged successively in the Y direction can be changed to the ON state simultaneously. However, it is difficult to realize the selection of a specific pattern such as an alternate ON state. This also applies to STTGX. In FIG. 3, the channel semiconductor layers 50*p*, 51*p* are formed of silicon and the thickness in the Y direction of the channel semiconductor layer 50*p* and the thickness in the X direction of the channel semiconductor layer 51*p* are set to, for example, about 5 nm.

Figure 4:
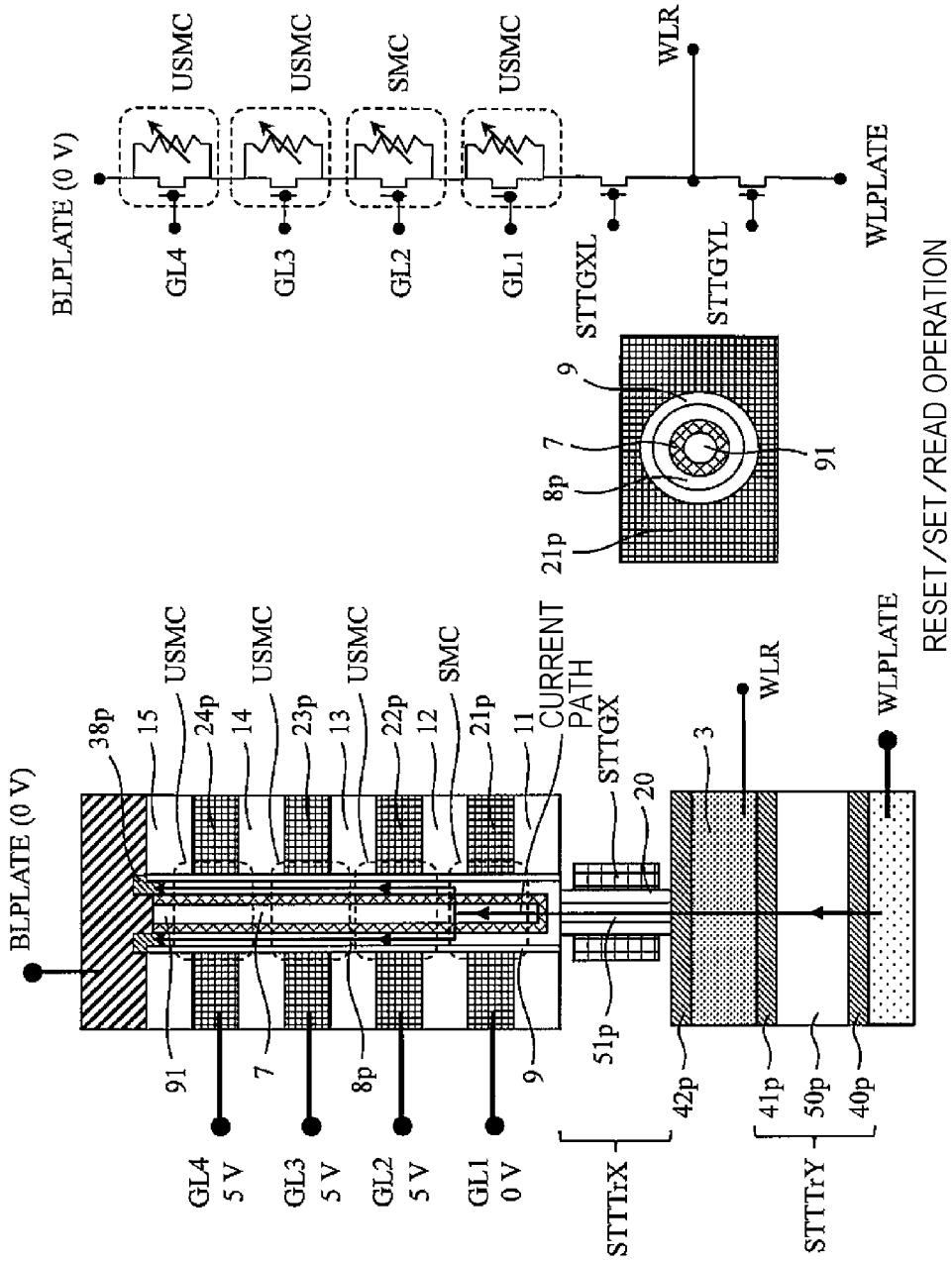
FIG. 4 is a side sectional view showing a portion of a memory cell array according to the first embodiment.

FIG. 4 is a side sectional view showing a portion of a memory cell array according to the first embodiment. Though omitted in FIGS. 2 and 3 for ease of understanding, gate polysilicon layers 21*p* to 24*p*, insulator films 11 to 15, a gate insulator film 9, a channel polysilicon layer 8*p*, an N type polysilicon layer 38*p*, a phase change material 7, and an insulator film 91 are shown as components of PCMCHAIN. Also, the gate insulator film 20 of STTrX is shown. The center diagram in FIG. 4 is a top view of the one gate polysilicon layer 21*p*. The right diagram in FIG. 4 is an equivalent circuit of one PCMCHAIN.

A diffusion layer made of the N type polysilicon layer 38*p* is formed in an upper portion of the channel polysilicon layer 8*p* and connected to the electrode BLPLATE in a plate shape to be an upper electrode. PCMCHAIN is formed inside a hole in the Z direction formed in a stacked body in which the polysilicon layers 21*p*, 22*p*, 23*p*, 24*p* to be cell gate electrodes and insulator films 11, 12, 13, 14, 15 are stacked alternately.

The reset operation/set operation can be performed, for example, as described below. 0 V is biased to a gate line GL1 to which a selected cell SMC is connected to turn off the transistor in which the channel polysilicon 8*p* is used as a channel. 5 V is biased to gate lines GL2, GL3, GL4 to which unselected cells USMC are connected to turn on the transistor. 0 V is biased to a bit line BLPLATE. STTrX/STTrY are turned on and 5 V and 4 V are biased to WLPLATE respectively. WLR is put into a floating state. The resistance of channel decreases for the unselected cells USMC when the transistor is turned on and thus, a current flows through the channel polysilicon 8*p*. Almost the same current can be made to flow regardless of the state of the phase change material 7 in the USMC portion. Because the transistor is turned off, a current flows through the phase change material 7 in SMC. In SMC, the reset operation/set operation are performed by changing the resistivity of the phase change material 7 by the current flowing through the phase change material 7.

For read operation, STTrX is changed to the ON state, STTrY is changed to the OFF state, and 1 V is biased to WLR. The resistance of channel decreases for the unselected cells USMC when the transistor is turned on and thus, a current flows through the channel polysilicon 8*p*. Almost the same current can be made to flow regardless of the state of the phase change material 7 in the USMC portion. Because the transistor is turned off, a current flows through the phase change material 7 in SMC. In SMC, the read operation is performed by detecting the value of current flowing through the phase change material 7 using a sense amplifier connected to WLR.

As the phase change material 7, for example, a material such as $Ge_2Sb_2Te_5$ that stores information by using the fact that the resistivity in an amorphous state and the resistivity in a crystalline state are different can be used. An operation that changes the amorphous state as a high-resistance state to the crystalline state as a low-resistance state, that is, a set operation is performed by heating a phase change material in an amorphous state to a temperature of crystallization or higher and maintaining the temperature about $10^{-6}$ s or longer to change to a crystalline state. The phase change material in the crystalline state is changed to a liquid state by being heated up to a temperature of the melting point or higher and then rapidly cooled to change to the crystalline state. In addition, the phase change material can change the temperature of crystallization and the melting point by using, even if the material is made of the same Ge, Sb, and Te, the material of different composition ratios. Also, the temperature of crystallization and the melting point can be changed by adding a fourth element to the material made of Ge, Sb, and Te. When a simultaneous set operation (bundle erase operation) described later is used, it is desirable to select a material of a higher temperature of crystallization. Even if a material of a high temperature of crystallization and a slow set speed is selected, a set operation of a large number of cells can be performed in parallel and thus, erasing throughput can adequately be maintained. Therefore, memory cells sufficiently resistant to a thermal disturbance during high-speed reset operation can be formed. Measures against thermal disturbances of bundle erasing itself will be described later.

FIGS. 5 to 8 are equivalent circuits of the semiconductor memory device in FIG. 3 and describes the read operation/set operation/set verify operation/reset operation respectively. The channel semiconductor layers 50*p*, 51*p* are thin and when an ON voltage is biased to gates on both sides, the X select transistor STTrX and the Y select transistor STTrY are turned on and when, even if the ON voltage is biased to one of both sides, a strong OFF voltage is biased to the other side, the transistor on the other side is turned off. To show this as equivalent circuits, the Y select transistor STTrY is represented as two transistors connected in series and opposite transistors are described like being connected in parallel.

Figure 5:
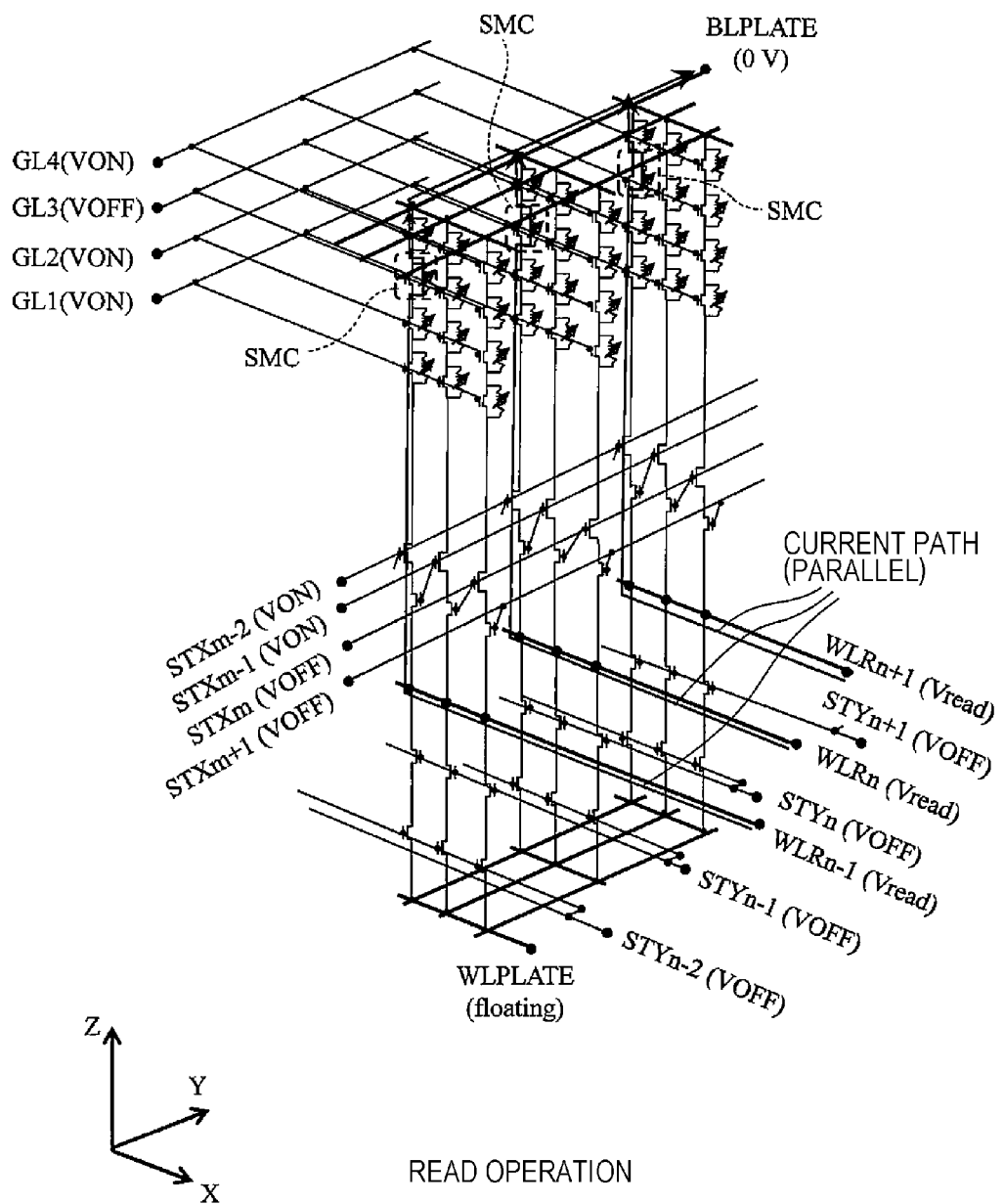
FIG. 5 is an equivalent circuit illustrating a read operation.

FIG. 5 is an equivalent circuit illustrating a read operation. In the read operation, the Y select transistors STTrY are all turned off and the plate electrode WLPLATE and the electrode 3 are electrically insulated. Whether the selected memory cell SMC is in a low-resistance set state/a high-resistance reset state is determined by detecting a current between the electrode wire 3 and BLPLATE on both sides of PCMCHAIN. The current passed at this point is a small current such that the resistive state of the phase change memory is not changed, that is, a current sufficiently smaller than a set current and a reset current. Accordingly, a non-destructive read can be performed.

The electrode wires 3 are arranged in the Y direction with the same pitches as those of PCMCHAIN and connected to a resistance sense amplifier on the semiconductor substrate. For example, by connecting each of the electrode wires 3 to an independent sense amplifier, as shown in FIG. 5, a plurality of PCMCHAIN arranged in the Y direction can be selected simultaneously to perform a parallel read. In contrast, when, like in PTL 3, upper and lower electrodes are in a plate shape and each Y select transistor STTrY is connected in parallel with respect to WLPLATE, currents read through each Y select transistor STTrY cannot be distinguished and thus, only one PCMCHAIN can be selected simultaneously. According to a semiconductor memory device according to the first embodiment, the number of bits that can be read in a unit time can greatly be increased by a parallel read.

In FIG. 5, a read operation is performed by simultaneously using WLR arranged successively in the Y direction, but a read operation may also be performed by using, for example, every other WLR to suppress noise generated by electrostatic capacity between neighboring WLR so that WLR not used for read operation can be kept at a fixed voltage.

Figure 6:
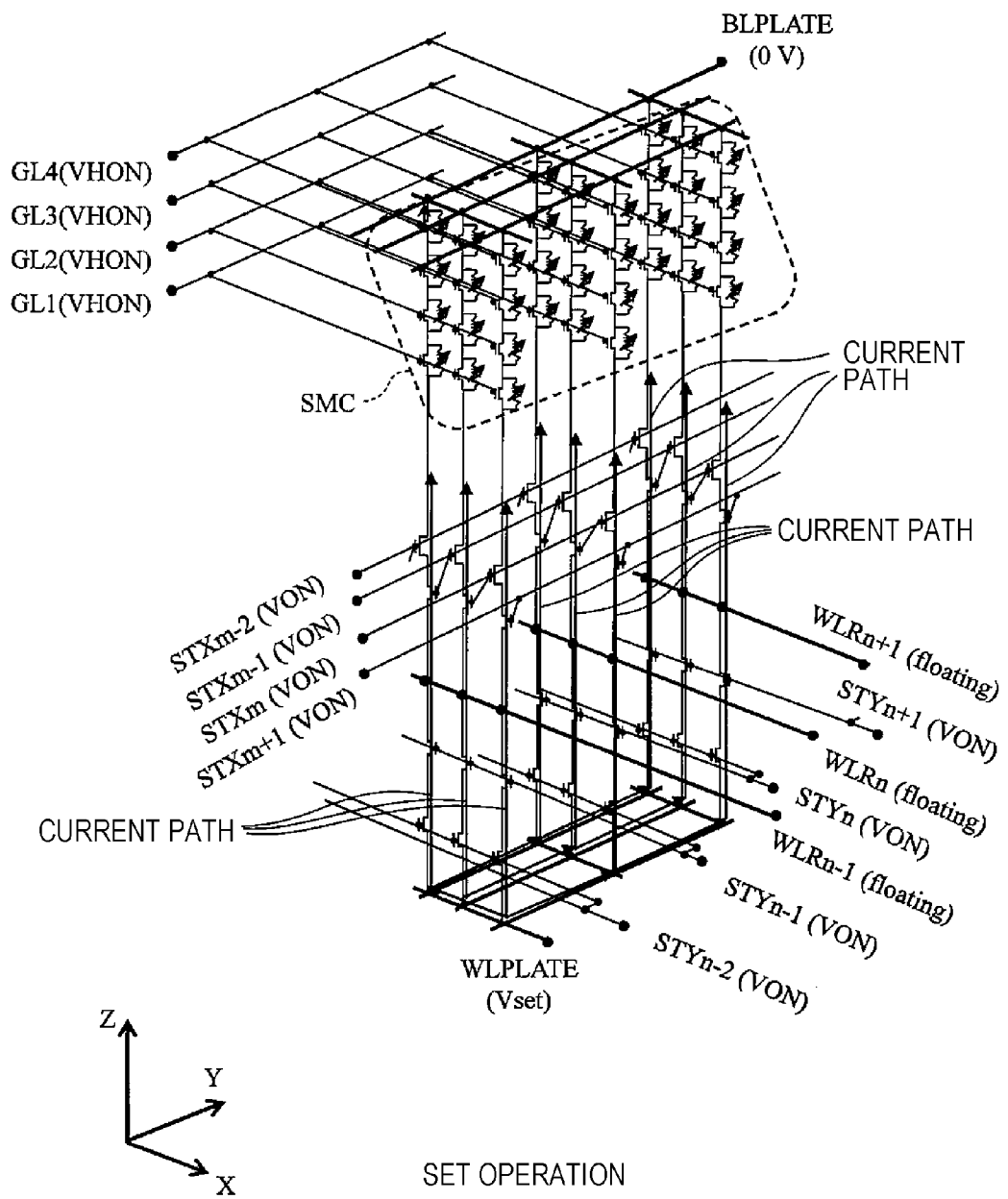
FIG. 6 is an equivalent circuit illustrating a set operation.

FIG. 6 is an equivalent circuit illustrating a set operation. In the set operation, the electrode 3 and a sense amplifier are insulated by a peripheral circuit. That is, the electrode 3 is insulated by a circuit other than STTrX and STTrY. The set operation is performed by passing a current between WLPLATE and BLPLATE via PCMCHAIN generating Joule heat by PCMCHAIN. In FIG. 6, a current is passed to a plurality of PCMCHAIN adjacent to each other in parallel and further, all memory cells in each PCMCHAIN are simultaneously selected for heating to perform a set operation (bundle erasing). Accordingly, heat is conducted between PCMCHAIN and when compared with a case in which a set operation is performed by selecting the memory cell one by one or a case in which a set operation is performed by selecting PCMCHAIN one by one, the set operation can be performed on more memory cells per unit power consumption. That is, the transfer rate of erase operation can be improved.

FIG. 6 shows a case in which a set operation is performed by passing a current to three successive PCMCHAIN in each of the X direction and the Y direction, that is, a total of nine PCMCHAIN. To perform a set operation at high speed, as described above, bulk erasing is adopted for the set operation and in a reset operation described later, data is programmed into each memory cell.

In resistance change type memories including phase change memories, it is necessary to pass a current to a resistance change element when a set operation is performed and thus, if the resistance of a memory cell becomes too high during reset operation, a sufficient current cannot be passed thereafter and there may arise a case in which a set operation cannot be performed or it becomes necessary to bias a higher voltage than that for normal set operation to pass a current. In PCMCHAIN, each memory cell has a configuration in which a phase change material layer and a cell transistor are connected in parallel and each memory cell is connected in series. Thus, during set operation, a current flowing through PCMCHAIN has a component flowing through the phase change material layer and a component flowing through the cell transistor. A set operation is performed in about 1 μs and thus, Joule heat generated in a channel of the cell transistor is conducted to the phase change material layer in contact with the channel. If an appropriate ON voltage (half ON voltage: VHON) is biased to the gate of the cell transistor and a voltage difference is provided to between WLPLATE/BLPLATE by adjusting the channel to an appropriate ON resistive state, Joule heat generated in the channel portion is conducted to the phase change material layer and a set operation can be performed. Therefore, even if the resistance of the phase change material layer becomes too high due to a reset operation, a set operation can be performed without the need to pass a current by biasing a high voltage to the memory cell. VHON shown in FIG. 6 exemplifies this operation.

In bundle erasing, currents are passed to a plurality of PCMCHAIN in parallel and thus, when compared with a case in which a set operation is performed by selecting the memory cell one by one or a case in which a set operation is performed by selecting PCMCHAIN one by one, the total of currents flowing during set operation becomes larger. However, currents are supplied using the low-resistance plate-shaped electrodes WLPLATE, BLPLATE and thus, the voltage drop of each electrode can sufficiently be suppressed even if the total of currents is large. In addition, the plate-shaped electrodes WLPLATE, BLPLATE are shared among a plurality of PCMCHAIN arranged in the X direction and the Y direction and thus, when compared with a separated electrode like, for example, the electrode 3, the number thereof can be reduced. Accordingly, the number of peripheral circuits to drive set currents, that is, the area of the wire selector 1008 in FIG. 1 can be reduced. Therefore, the cost can advantageously be reduced.

In bundle erasing, power consumption for set operation is reduced by using heat conducted between PCMCHAIN and thus, an unintended set operation may be caused by heat being conducted to PCMCHAIN that is adjacent to PCMCHAIN that performs bundle erasing and that should not be erased. A countermeasure technology for such a thermal disturbance of the bundle erasing will be described later.

Figure 7:
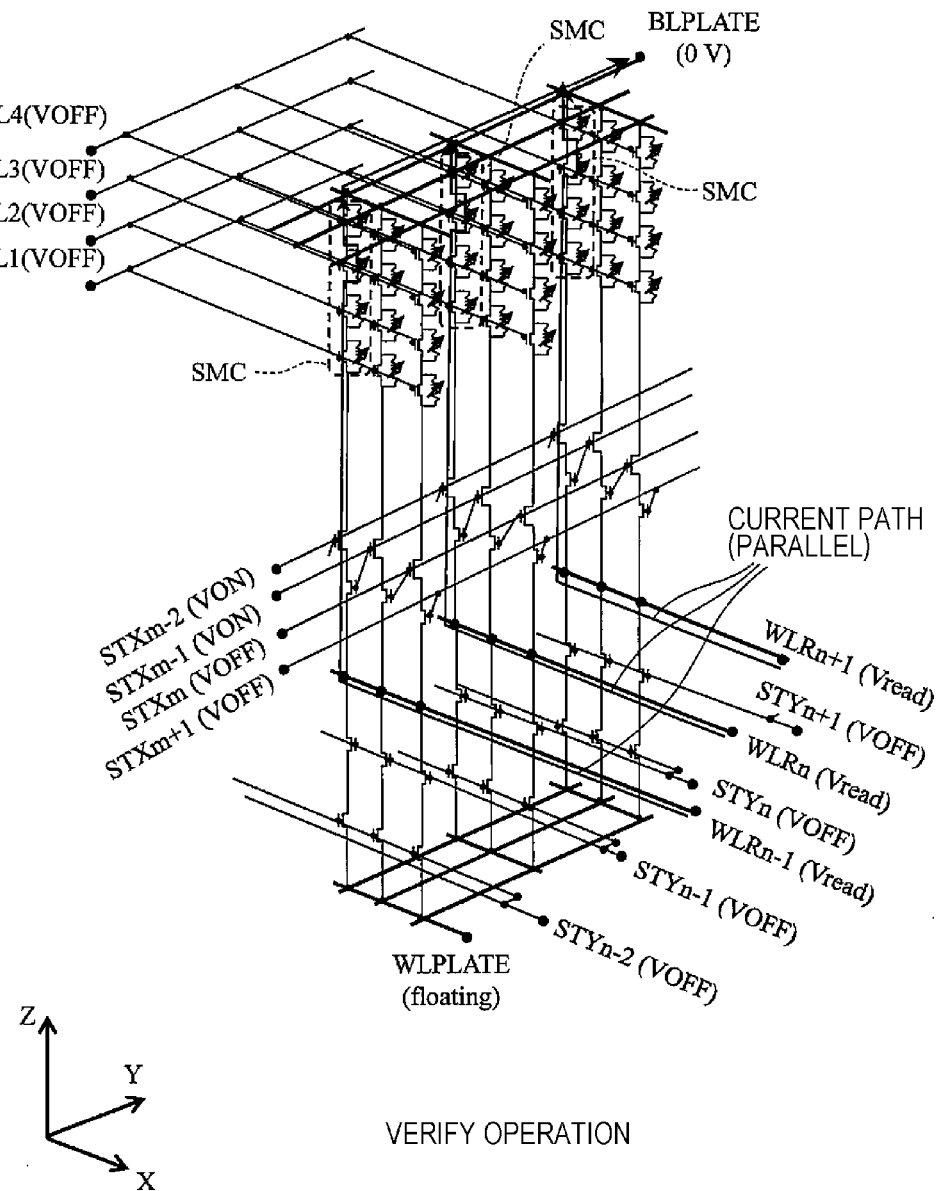
FIG. 7 is an equivalent circuit illustrating a verify operation that verifies a simultaneous set operation result shown in FIG. 6.

FIG. 7 is an equivalent circuit illustrating a verify operation that verifies a simultaneous set operation result shown in FIG. 6. All cells inside PCMCHAIN should have been changed to a low-resistance state by the simultaneous set operation shown in FIG. 6. This can be checked by performing a read operation similar to that in FIG. 5. More specifically, gates of a plurality of layers are simultaneously changed to an OFF state and a plurality of cells connected in series inside PCMCHAIN is simultaneously selected to perform a read operation. Alternatively, as shown in FIG. 7, a read operation may be performed after changing the gates of all layers to an OFF state. If all cells inside PCMCHAIN are in a low-resistance state, even if a plurality of cells connected in series is simultaneously selected and a read operation is performed, all layers can be determined to be in a low-resistance state without the need to distinguish individual layers since the resistance is sufficiently low when compared with a case in which a cell in a reset state is contained.

If it is determined that, as a result of verify operation, a memory cell that is not changed to a set state is contained in PCMCHAIN, bundle erasing described with reference to FIG. 6 is performed again. In this case, a simultaneous set operation is performed only on PCMCHAIN containing a memory cell that is not changed to a set state or a set operation is performed for each cell of PCMCHAIN containing a memory cell that is not changed to a set state.

In FIG. 7, a verify operation is performed using WLR arranged successively in the Y direction, but a verify operation may also be performed by using, for example, every other WLR to suppress noise generated by electrostatic capacity between neighboring WLR so that WLR not used for verify operation can be kept at a fixed voltage.

Figure 8:
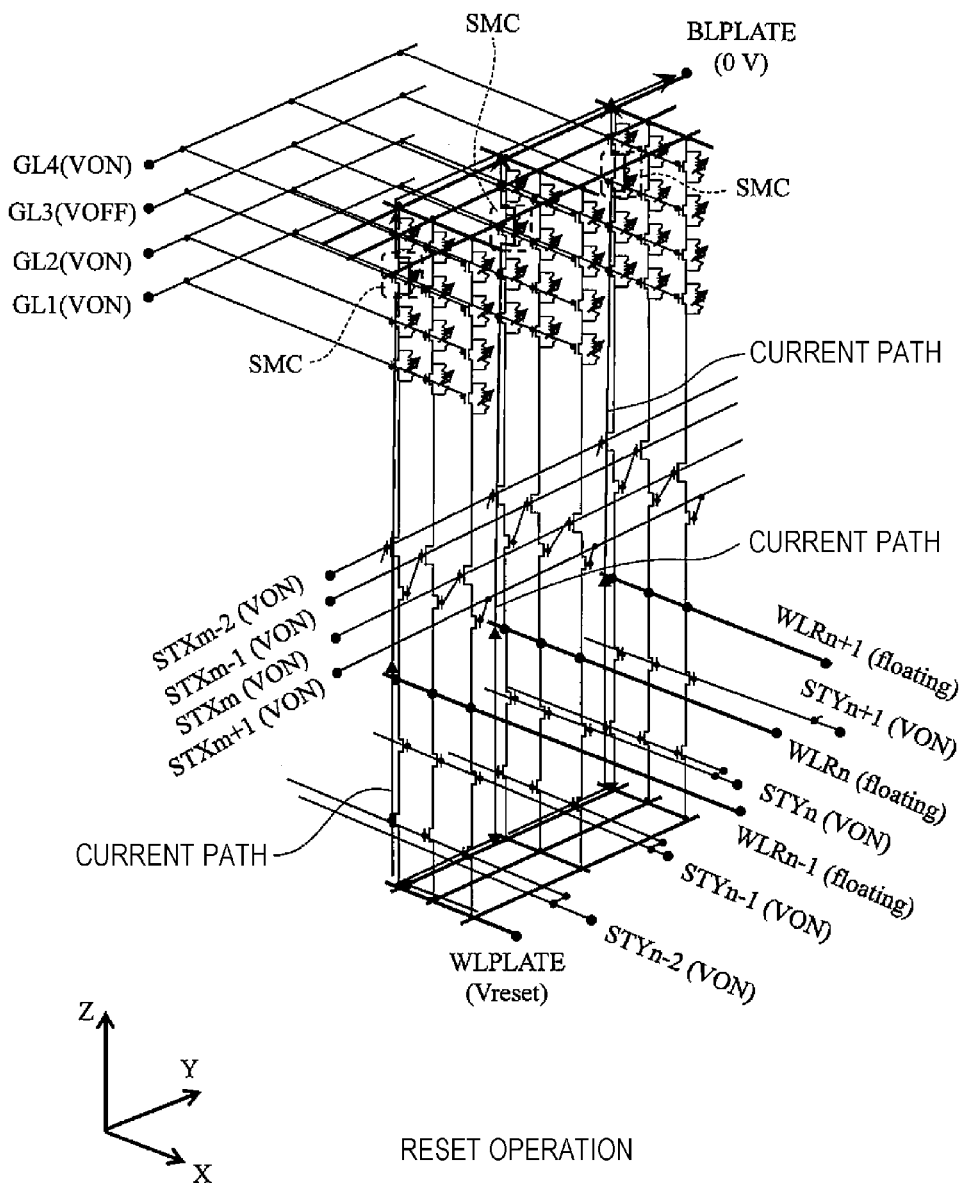
FIG. 8 is an equivalent circuit illustrating a reset operation.

FIG. 8 is an equivalent circuit illustrating a reset operation. In the reset operation, like the set operation, the electrode 3 and a sense amplifier are insulated by a peripheral circuit. That is, the electrode 3 is insulated by a circuit other than STTrX and STTrY. A reset operation is performed, like a set operation, by passing a current between WLPLATE and BLPLATE through PCMCHAIN. However, while the set operation adopts bulk erasing, the reset operation is a data programming operation and is selectively performed on each memory cell.

The X select transistor STTrX connected to the selected PCMCHAIN is turned on and also the Y select transistor STTrY connected via the electrode 3 is turned on. An OFF voltage is biased to the cell transistor of the selected cell SMC and an ON voltage is biased to the cell transistor of the unselected cell USMC. If, in this state, a voltage difference is biased to between WLPLATE and BLPLATE, a current flows to the phase change material layer of the selected cell SMC. By adopting a wave form of about 10 ns for the voltage between WLPLATE and BLPLATE and making particularly deactivation steep, like a normal phase change memory, the phase change material layer of SMC can be changed from a crystalline state (set state) of low resistance to an amorphous state (reset state) of high resistance. Like the set operation, only one PCMCHAIN can be selected between the plate electrodes WLPLATE and BLPLATE or a plurality thereof can be selected simultaneously. This is because, in contrast to the read operation, there is no need to detect a current flowing through each PCMCHAIN.

Because a reset operation is performed by a current between plate electrodes shared by a plurality of PCMCHAIN, that is, between WLPLATE and BLPLATE, the number of peripheral circuits to drive a reset current, that is, the area of the wire selector 1008 in FIG. 1 can be reduced, which is advantageous for the reduction of cost.

First Embodiment

Modification of the Wire Structure

FIGS. 9(a) and 9(b) are diagrams showing a modification of the structure of the PCMCHAIN array illustrated with reference to FIGS. 1 to 4. In contrast to the structure described with reference to FIGS. 1 to 4, the electrode 3 and the Y select transistor STTrY are arranged above PCMCHAIN and the Y select transistor STTrY is connected to BLPLATE. BLPLATE and WLPLATE may be interchanged.

The channel semiconductor layer 8p is connected to the channel semiconductor layer 51p of the X select transistor STTrX below PCMCHAIN and the lower portion of the channel semiconductor layer 51p is connected to the plate electrode WLPLATE via the N type semiconductor layer 40p. The channel semiconductor layer 8p is connected to the electrode 3 via the N type semiconductor layer 41p above PCMCHAIN and the upper portion of the electrode 3 is connected to the channel semiconductor layer 50p of the Y select transistor STTrY via the N type semiconductor layer 42p. The upper portion of the channel semiconductor layer 50p is connected to the plate electrode BLPLATE. In FIG. 9(a), the channel semiconductor layer 50p of the Y select transistor STTrY extends, like in FIGS. 1 to 4, in the X direction like the electrode 3. The channel semiconductor layer 51p of the X select transistor STTrX connecting PCMCHAIN and WLPLATE is not, in contrast to FIGS. 1 to 4, separated completely in the Y direction, the lower half thereof is shared among PCMCHAIN adjacent along the Y direction, and a recess is formed in the upper half thereof in a gap portion between neighboring PCMCHAIN.

FIG. 9(b) is a YZ sectional view of the channel semiconductor layer 51p shown in FIG. 9(a). If the channel semiconductor layers 51p are linked in the Y direction as shown in FIG. 9(a), the channel width of STTrX is increased and thus, a larger current can be driven, but a leak current flows between a selected chain SPCMCHAIN and an unselected chain USPCMCHAIN, which hinders an operation. To limit the leak current to a permissible value or less, it is necessary to secure a path LEAKPATH through which the leak current flows to a certain length or longer. For example, the length needs to be a minimum value LCHMIN capable of securing a source/drain withstand voltage or longer. More specifically, the depth of a recess may be half LCHMIN or more.

Figure 10:
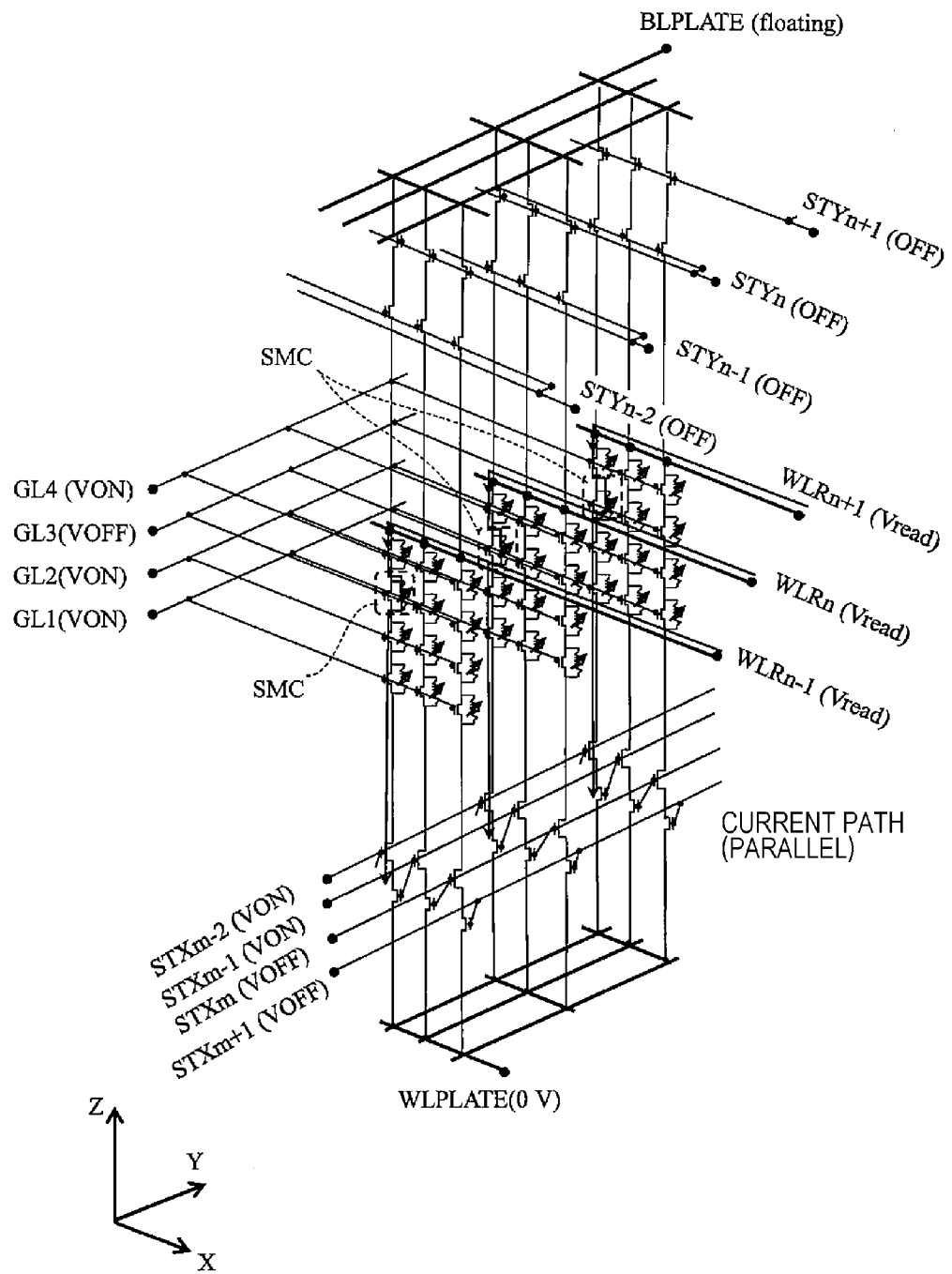
FIG. 10 is an equivalent circuit illustrating the read operation of the semiconductor memory device in FIG. 9(a).

FIG. 10 is an equivalent circuit illustrating the read operation of the semiconductor memory device in FIG. 9(a). The read operation is performed by passing a current between the electrode 3 and the lower electrode WLPLATE via PCMCHAIN and detecting the resistance of the phase change material layer of a memory cell. Like in FIG. 5, a parallel read can be implemented by individually connecting each of the electrodes 3 to a sense amplifier. Therefore, the data transfer rate of the read operation can be improved.

A set operation can be performed by, like in FIG. 6, insulating the electrode 3 from the sense amplifier and passing currents to a plurality of PCMCHAIN in parallel between BLPLATE and WLPLATE. By performing a bundle erase operation like in FIG. 6, a high-speed erase transfer rate can be realized. A verify operation can be performed by, like in FIG. 7, selecting a plurality of cells connected in series inside PCMCHAIN simultaneously and also in parallel for a plurality of PCMCHAIN. A reset operation can be performed by, like in FIG. 8, passing a current between BLPLATE and WLPLATE via PCMCHAIN.

In FIGS. 2 to 10, the ON/OFF control of the X select transistor STTrX and the Y select transistor STTrY is exercised by two gates arranged on both sides of the thin channel semiconductor layers 51p, 50p and capable of independently feeding power, but a normal surround gate type vertical transistor may also be used.

First Embodiment

Summary

As has been described above, a semiconductor memory device according to the first embodiment can improve the bit cost by using upper and lower electrode in a plate shape to limit the area of wires or peripheral circuits while driving a large current needed for a set operation/reset operation. IN addition, the plate electrode has a small resistance and thus, performance of the set operation/reset operation can be enhanced.

A semiconductor memory device according to the first embodiment includes the electrode 3 provided by being paired with the Y select transistor STTrY between the X select transistor STTrX and STTrY and after STTrY is turned off and the lower electrode and the electrode 3 are insulated for read operation, a parallel read is performed by using a plurality of the electrodes 3 simultaneously. Accordingly, performance of the read operation can be enhanced. That is, the full performance of all of the set operation/reset operation/read operation can be exploited.

Second Embodiment

When a set operation/reset operation is performed on a memory cell, as described above in the first embodiment, it is necessary to pass a current to the memory cell and thus, Joule heat is generated. If the Joule heat is propagated to surrounding PCMCHAIN, information may unintendedly be programmed/erased in the PCMCHAIN. A phenomenon in which Joule heat is unintendedly propagated to surrounding PCMCHAIN (or memory cells) is called a thermal disturbance.

If the number of times of thermal disturbance occurrence increases, the possibility of a memory cell being unintendedly programmed/erased increases. Thus, it is desirable to minimize thermal disturbance occurrences if possible. In a second embodiment of this invention, therefore, a configuration example capable of curbing the influence of thermal disturbance as much as possible will be described. The configuration of the semiconductor memory device according to the second embodiment may be the same as that in the first embodiment or a different configuration as long as a plurality of PCMCHAIN having memory cells in which a phase change element and a cell transistor are connected in parallel is arranged in the X and Y directions.

When a set operation/reset operation is performed on some PCMCHAIN, a thermal disturbance arises for PCMCHAIN arranged on both sides thereof. However, if PCMCHAIN subject to the thermal disturbance does not contain information, the influence of thermal disturbance can be ignored. To realize this, before information programming (reset operation), information held by surrounding PCMCHAIN may once be erased (bundle erasing) before the information being sequentially programmed in each of the XYZ directions.

Information programming in the X direction will be considered as an example. In the second embodiment, the controller 1009 once performs bundle erasing of information for PCMCHAIN adjacent in the X direction and then performs a reset operation sequentially along the X direction. When a reset operation is performed on some PCMCHAIN, a thermal disturbance arises for PCMCHAIN on both sides thereof, but PCMCHAIN on which no reset operation has been performed has no information and thus, the influence of thermal disturbance can be ignored. That is, only PCMCHAIN into which information has been programmed is subject to thermal disturbance and thus, the number of times of being subject to thermal disturbance in each of the XYZ directions is once, leading to the total of three times for each PCMCHAIN to be subject to thermal disturbance.

If a reset operation is performed in random order, by contrast, PCMCHAIN is subject to thermal disturbance on both sides in each of the XYZ directions and thus, the number of times of being subject to thermal disturbance of each PCMCHAIN is six times that of a reset operation. If, for example, data is programmed a million times, each memory cell may be subject to thermal disturbance by a reset operation a million times on both sides in each of the XYZ directions, leading to six million times of thermal disturbance subjection. By combining and performing bundle erasing and a reset operation as a pair as described above, the number of times of being subject to thermal disturbance can be reduced for each memory cell.

On the other hand, if bundle erasing and a reset operation are combined and performed as a pair as described above, a thermal disturbance is caused by the bundle erasing itself. A thermal disturbance caused by a reset operation can be suppressed to some extent by using a phase change material whose crystallization rate is slow. In the bundle erasing, however, even if a phase change material whose crystallization rate is slow is used, the time needed for bundle erasing becomes longer correspondingly and a thermal disturbance time also becomes longer and thus, the thermal disturbance is considered not sufficiently suppressible by appropriately selecting the phase change material.

Figure 11:
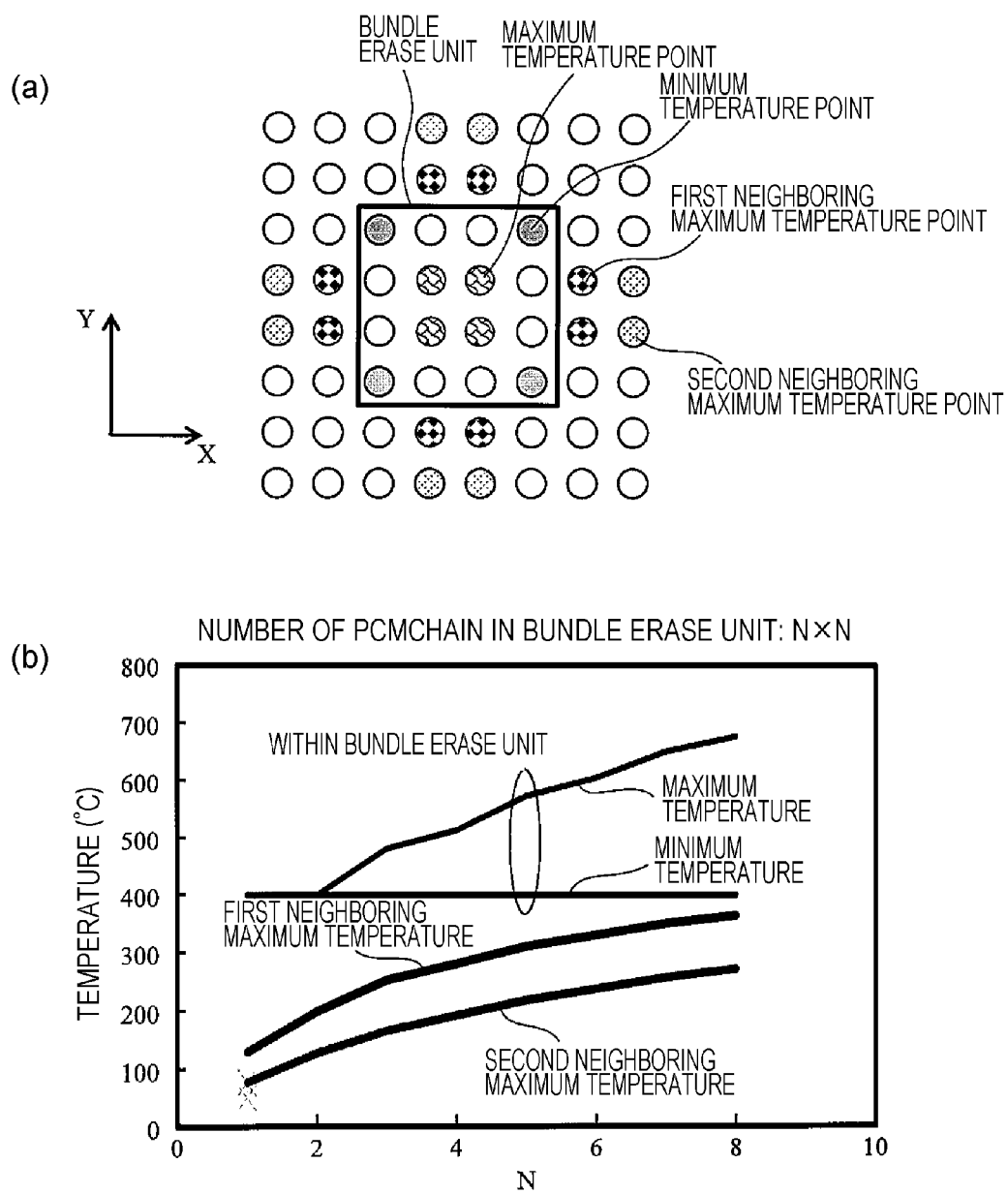
FIGS. 11(a) and 11(b) are diagrams showing a Joule heat distribution when Joule heat is generated by passing the same current to all N×N PCMCHAIN forming a bundle erase unit.

If Joule heat is made equal by passing the same current to a plurality of PCMCHAIN in the bundle erase unit, the temperature of PCMCHAIN in the center portion of the bundle erase unit becomes higher than the temperature of PCMCHAIN on a corner. If the temperature of PCMCHAIN on the corner is raised to a temperature sufficient for crystallization, a strong disturbance is caused by heat conducted to surrounding PCMCHAIN of the bundle erase unit. In addition, the temperature of PCMCHAIN in the center becomes too high and degradation thereof is accelerated. This will be described using FIG. 11.

FIGS. 11(a) and 11(b) are diagrams showing a Joule heat distribution when Joule heat is generated by passing the same current to all N×N PCMCHAIN forming a bundle erase unit. FIG. 11(a) is a top view of PCMCHAIN when N=4. The temperature inside the bundle erase unit is the highest in the center and the lowest on four corners. PCMCHAIN closest to the bundle erase unit among PCMCHAIN surrounding the bundle erase unit reaches a first neighboring maximum temperature and PCMCHAIN adjacent thereto reaches a second neighboring maximum temperature.

FIG. 11(b) shows results of measurement by changing the value of N of the temperature at each point of FIG. 11(a) when the temperature on four corners is made to sufficiently exceed the temperature of crystallization by passing the same current to all PCMCHAIN inside the bundle erase unit. It is clear that while erase throughput is advantageously improved with an increasing number of PCMCHAIN (=N) inside the bundle erase unit, there are disadvantages such as too high a temperature in the center of the bundle erase unit and decreased reliability due to thermal disturbance with a rising temperature in a neighboring region of the bundle erase unit.

Thus, in the second embodiment, the controller 1009 reduces the heating value per unit time in the center of the bundle erase unit and also increases the heating value in the periphery to control Joule heat in PCMCHAIN performing bundle erasing. Accordingly, the temperature of PCMCHAIN in the bundle erase unit is uniformly raised to the temperature of crystallization or higher and surrounding PCMCHAIN performing no bundle erasing is inhibited from rising in temperature.

Though it appears that increasing the heat value in the periphery increases the influence of thermal disturbance on surrounding PCMCHAIN, but the heating value in the center is far larger than that in the periphery and thus, the thermal disturbance in the periphery can be limited more as a whole by limiting the heating value in the center.

Figure 12:
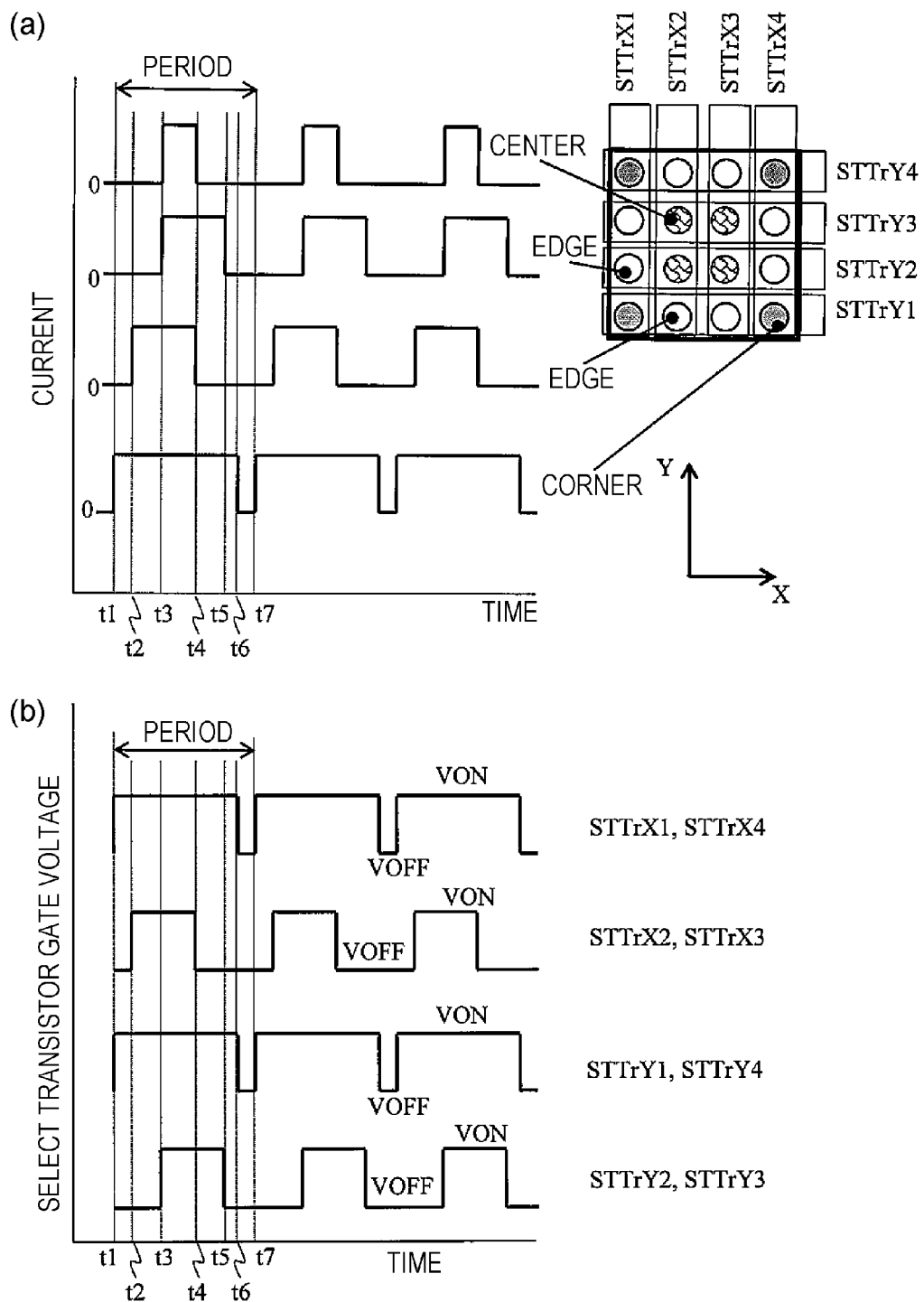
FIGS. 12(a) and 12(b) are diagrams illustrating a technique to adjust a heating value in the bundle erase unit.

FIGS. 12(a) and 12(b) are diagrams illustrating a technique to adjust a heating value in the bundle erase unit. FIG. 12(a) shows the wave form of a current pulse supplied to each PCMCHAIN in the bundle erase unit. The bundle erasing is performed by a periodic pulse current of a plurality of times to decrease the on duty ratio of pulse in the center of the bundle erase unit and to increase the on duty ratio on corners. The amplitude of the current pulse is constant regardless of location. Due the wave form, Joule heat per unit time is small in the center and large on corners. As a result, when compared with a case of FIG. 11, the temperature inside the bundle erase unit can be made more uniform and the thermal disturbance on surrounding PCMCHAIN can be reduced.

FIG. 12(b) is an on/off timing diagram of each select transistor when a pulse in FIG. 12(a) is realized using a semiconductor memory device according to the first embodiment. Here, the bundle erase unit comprised of 4×4 PCMCHAIN is exemplified, but can easily be extended to the bundle erase unit of N×N.

When a semiconductor memory device according to the first embodiment is used, PCMCHAIN is selected by combining ON/OFF states of STTrX1 to STTrX4 and STTrY1 to STTrY4. The X selection of PCMCHAIN in the center is made by STTrX2 and STTrX3 and the Y selection is made by STTrY2 and STTrY3. The X selection of PCMCHAIN on the X direction end is made by STTrX1 and STTrX4 and the Y selection is made by STTrY2 and STTrY3. The X selection of PCMCHAIN on the Y direction end is made by STTrX2 and STTrX3 and the Y selection is made by STTrY1 and STTrY4. The X selection of PCMCHAIN on a corner is made by STTrX1 and STTrX4 and the Y selection is made by STTrY1 and STTrY4.

Viewing the time t1 to t7 in FIGS. 12(a) and 12(b), a current flows through center cells only between time t3 to t4 at which STTrX2, STTrX3, STTrY2, and STTrY3 are turned on. A current flows through PCMCHAIN on the X direction end only between time t3 to t5 at which STTrX1, STTrX4, STTrY2, and STTrY3 are turned on. A current flows through PCMCHAIN on the Y direction end only between time t2 to t4 at which STTrX2, STTrX3, STTrY1, and STTrY4 are turned on. A current flows through PCMCHAIN on a corner only between time t1 to t6 at which STTrX1, STTrX4, STTrY1, and STTrY4 are turned on.

FIGS. 13(a) and 13(b) are diagrams illustrating a second technique to adjust the heating value in the bundle erase unit. FIG. 13(a) shows the wave form of a current pulse supplied to each PCMCHAIN in the bundle erase unit. The current amplitude in the center portion inside the bundle erase unit is decreased and the current amplitude on a corner is increased. The current pulse width is constant regardless of location. The same effect as that shown in FIG. 12 can also be achieved by the wave form shown in FIG. 13.

FIG. 13(b) is an on/off timing diagram of each select transistor when the pulse in FIG. 13(a) is realized using a semiconductor memory device according to the first embodiment. Like FIG. 12, the bundle erase can be extended to the bundle erase unit of N×N.

When a semiconductor memory device according to the first embodiment is used, PCMCHAIN is selected by combining ON/half ON/OFF states of STTrX1 to STTrX4 and STTrY1 to STTrY4. In the second embodiment, a voltage higher than a threshold voltage and lower than an ON state is biased to the gate of a transistor and a state in which the resistance is higher than that in an ON state and lower than that in an OFF state is called a half ON state.

As shown in FIG. 13(b), a current flows through center cells because STTrX2, STTrX3, STTrY2, and STTrY3 are in a half ON state after a half ON voltage VHON being biased to the gates thereof, but the voltage biased to PCMCHAIN decreases due to a voltage drop in both of STTrX and STTrY and the current flowing therethrough is small. STTrX1 and STTrX4, to whose gates an ON voltage VON is biased, are in a complete ON state, but STTrY2 and STTrY3 are in a half ON state and thus, the voltage biased to PCMCHAIN on the X direction end decreases due to a voltage drop in STTrY and the current is rather small. STTrY1 and STTrY4 are in a complete ON state, but STTrX2 and STTrX3 are in a half ON state and thus, the voltage biased to PCMCHAIN on the Y direction end decreases due to a voltage drop in STTrX and the current is rather small. STTrX1, STTrX4, STTrY1, and STTrY4 are in a complete ON state and most of the voltage between WLPLATE and BLPLATE is biased to PCMCHAIN on a corner and a large current flows.

In the above description, a technique to make Joule heat uniform in the XY directions has been described, but Joule heat can also be made uniform in the Z direction. In the temperature distribution of PCMCHAIN in the Z direction, the temperature of memory cells in the top layer and the bottom layer drops when the generation of Joule heat is uniform. Thus, by setting the voltage of cell transistor gates of the top layer and the bottom layer whose temperature is more likely to drop lower than other voltages and increasing the channel resistance, more Joule heat is generated in a cell transistor channel of memory cells of the top layer and the bottom layer when a current is passed to PCMCHAIN to be able to make the temperature inside PCMCHAIN uniform.

Second Embodiment

Summary

As has been described above, a semiconductor memory device according to the second embodiment decreases Joule heat generated in the center portion inside the bundle erase unit and increases Joule heat generated in a peripheral portion of the bundle erase unit by adjusting the current supplied to PCMCHAIN. Accordingly, Joule heat inside the bundle erase unit can be made uniform so that a thermal disturbance generated in surrounding PCMCHAIN during bundle erase operation can be suppressed.

Third Embodiment

In the second embodiment, suppressing a thermal disturbance for surrounding PCMCHAIN by decreasing Joule heat generated inside the bundle erase unit in the center portion and increasing Joule heat generated on an end has been described. In the third embodiment, a configuration example that suppresses a thermal disturbance by the arrangement of PCMCHAIN will be described. The other configuration of the semiconductor memory device is the same as that in the first and second embodiments and thus, the description will focus on the configuration to suppress a thermal disturbance below.

Figure 14:
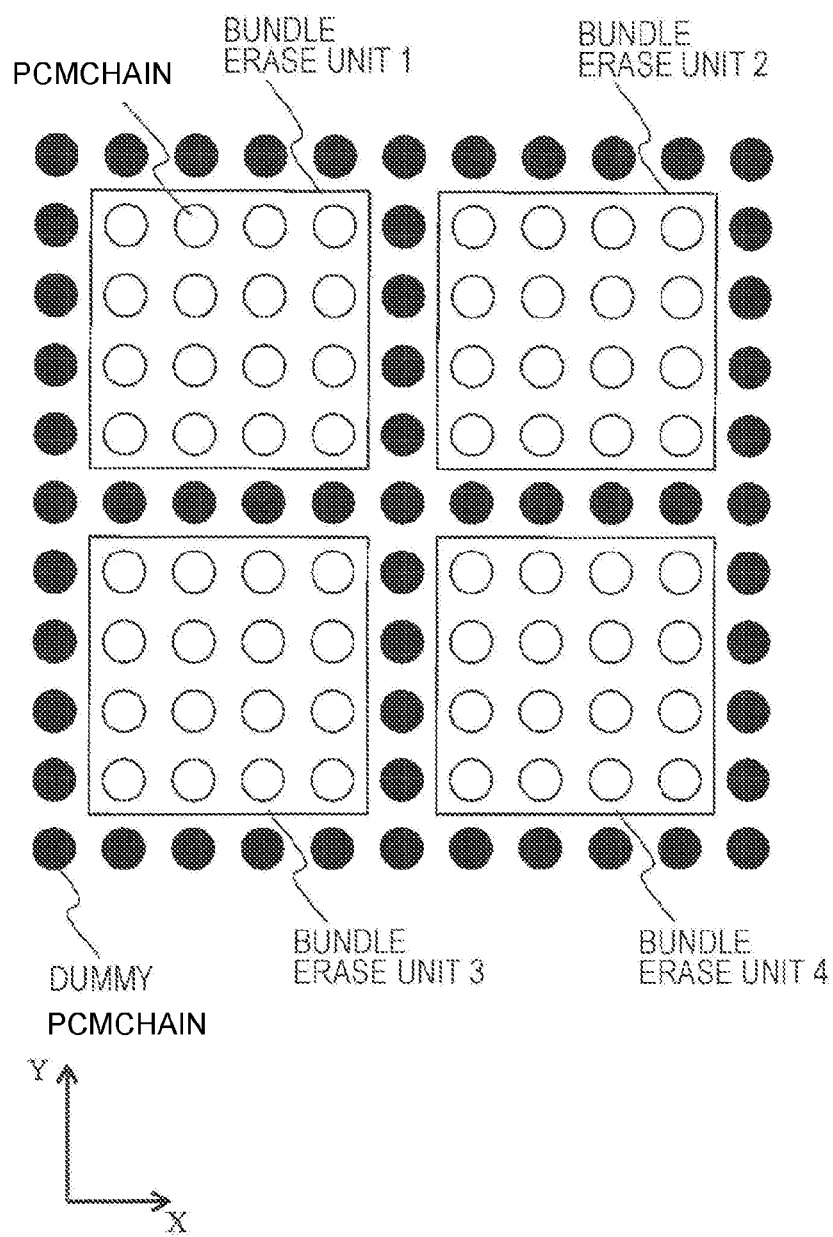
FIG. 14 is a diagram in which the PCMCHAIN array in the semiconductor memory device according to a third embodiment is projected onto a main surface of a semiconductor substrate.

FIG. 14 is a diagram in which the PCMCHAIN array in the semiconductor memory array according to the third embodiment is projected onto a main surface of a semiconductor substrate. White circles indicate PCMCHAIN. Black circles indicate a dummy chain that is not involved in information programming or reading. Though the memory capacity of the semiconductor memory device decreases due to the presence of the dummy chain that does not store information, cells in the dummy chain are not affected even if subjected to thermal disturbance and thus plays the role as a buffer area of thermal disturbance between PCMCHAIN.

In FIG. 14, the distance between inflicting PCMCHAIN (memory chain causing a thermal disturbance) and inflicted PCMCHAIN (memory chain subject to a thermal disturbance) is increased by arranging a dummy chain therebetween, but the same effect can also be achieved by simply increasing the distance between both without arranging the dummy chain.

Fourth Embodiment

In the second and third embodiments, configuration examples that mitigate the influence of a thermal disturbance by suppressing the thermal disturbance have been described. On the other hand, the location of PCMCHAIN affected by a thermal disturbance caused by bundle erasing is already known when the bundle erasing is performed and thus, information can be read from memory cells and saved before the bundle erasing is performed. In the fourth embodiment, a concrete operation example thereof will be described. The configuration of a semiconductor memory device is the same as that in the first to third embodiments and thus, the operation to save information will mainly be described below.

FIGS. 15(a) and 15(b) are operation flows when the semiconductor memory device according to the fourth embodiment performs bundle erasing. Here, FIGS. 15(a) and 15(b) are shown as two techniques to curb the influence of a thermal disturbance accompanying bundle erasing. The controller 1009 performs bundle erasing according to the operation flow of one of FIGS. 15(a) and 15(b). Hereinafter, each step in FIG. 15 will be described.

In step A1, the controller 1009 reads data in inflicted PCMCHAIN and temporarily stores the data in a memory device such as a buffer memory. In step A2, the controller 1009 performs bundle erasing of inflicting PCMCHAIN. In step A3, the controller 1009 performs a reset operation on memory cells in a reset state in step A1 again to restore the state of memory cells. With the above operation, even if a thermal disturbance is caused by bundle erasing being performed on inflicting PCMCHAIN, data inside inflicted PCMCHAIN can be prevented from being lost.

In step B1, the controller 1009 reads data in inflicted PCMCHAIN and temporarily stores the data in a memory device such as a buffer memory. In step B2, the controller 1009 performs bundle erasing of inflicting PCMCHAIN. In step B3, the controller 1009 reads data in inflicted PCMCHAIN again to compare with data read in step B1. If, as a result of comparison, a memory cell in a reset state in step B1 has changed to a set state, the controller 1009 performs a reset operation on the memory cell again to restore the state of the memory cell (B4).

The operation flow shown in FIG. 15(*a*) performs a read operation only once (A1) and thus, the operation thereof is faster than the operation flow shown in FIG. 15(*b*). The operation flow shown in FIG. 15(*b*) performs a reset operation only on a memory cell whose data has been programmed/erased and thus, when compared with the operation flow shown in FIG. 15(*a*), the influence of a thermal disturbance caused by a reset operation decreases and thus, reliability is improved.

Fifth Embodiment

In the fourth embodiment, the loss of data after a cell in a reset state changes to a set state due to a thermal disturbance caused by bundle erasing performed once has been described. On the other hand, there is a case in which data is not lost by a thermal disturbance caused by bundle erasing performed once, but the resistance of a memory cell in a reset state is gradually decreased by repeating the bundle erasing to change to a set state. In the fifth embodiment of this embodiment, an operation example to prevent the above case will be described. The configuration of a semiconductor memory device is the same as that in the fourth embodiment and thus, the description below focuses on differences of the operation to prevent the data loss from that in the fourth embodiment.

Figure 16:
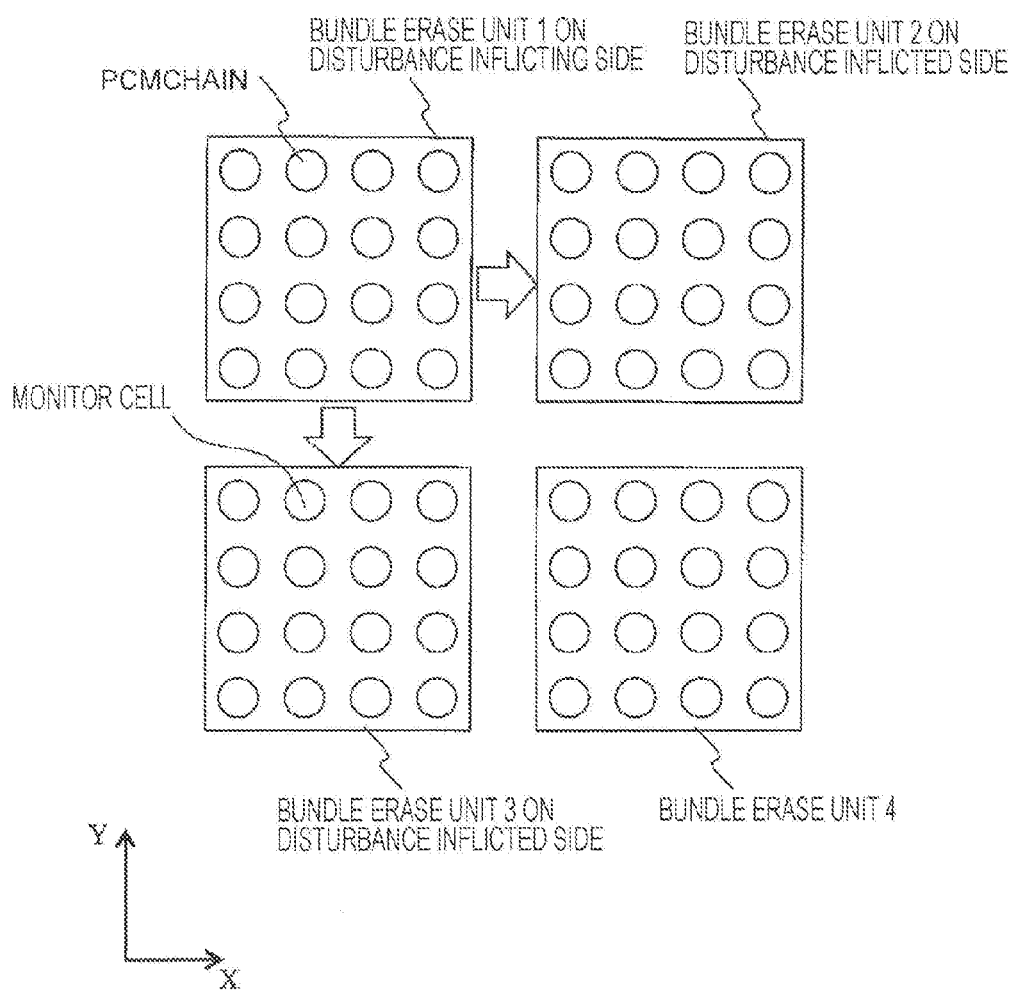
FIG. 16 is a diagram exemplifying the position of a memory chain where a thermal disturbance occurs.

FIG. 16 is a diagram exemplifying the position of PCM-CHAIN where a thermal disturbance occurs. The thermal disturbance occurs on the border between bundle erase units. In this fifth embodiment, both of a thermal disturbance caused by the bundle erasing itself and, as described in the fourth embodiment, a thermal disturbance caused when a reset operation is again performed on a memory cell having been subject to a thermal disturbance are considered. The monitor cell shown in FIG. 16 can be arranged anywhere inside inflicted PCMCHAIN. The role of the monitor cell will be described with reference to FIG. 17(*b*).

Figure 17:
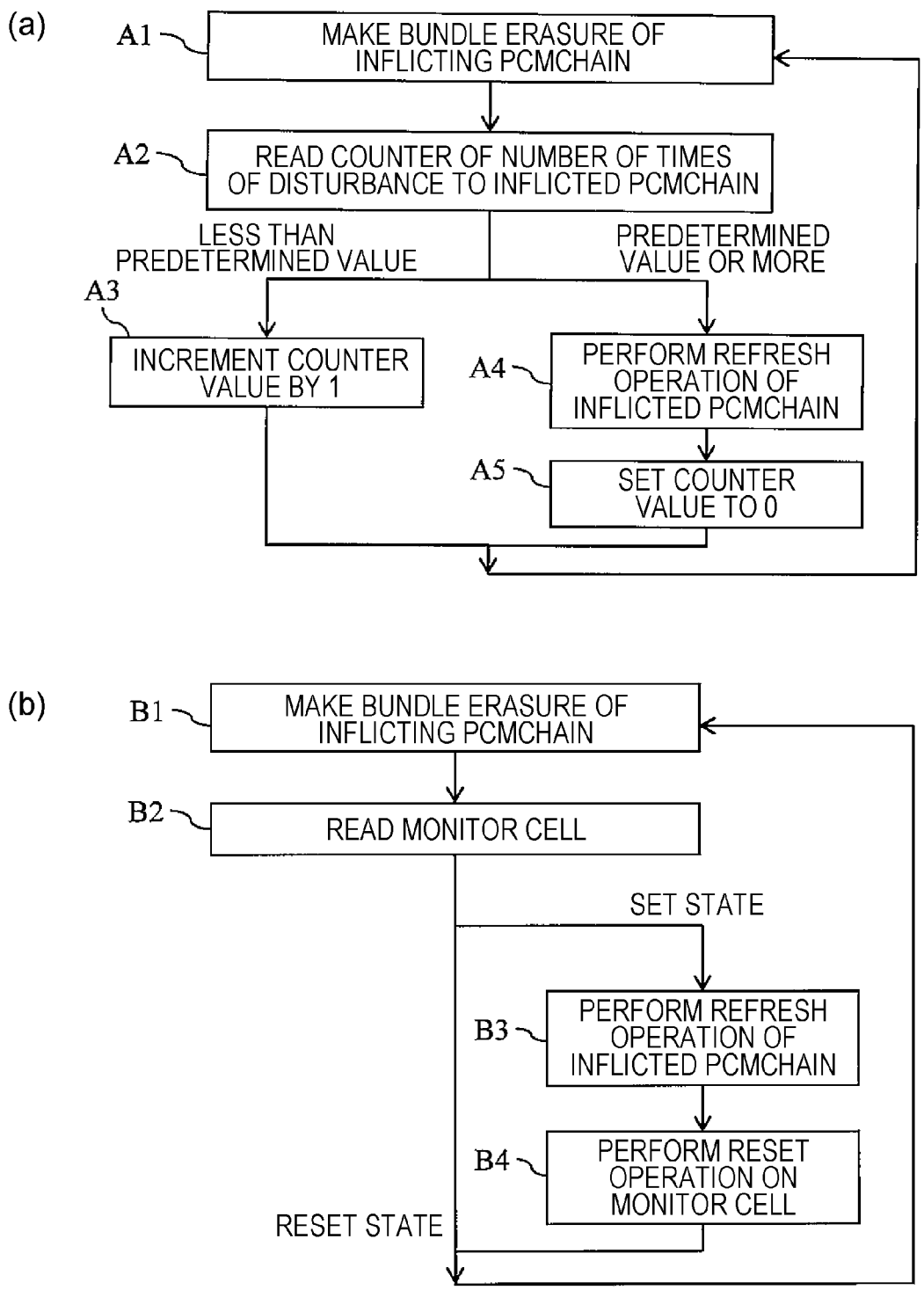
FIGS. 17(a) and 17(b) are operation flows when the semiconductor memory device according to a fifth embodiment performs the bundle erasing.

FIGS. 17(*a*) and 17(*b*) are operation flows when the semiconductor memory device according to the fifth embodiment performs bundle erasing. Here, FIGS. 17(*a*) and 17(*b*) are shown as two techniques to curb the influence of a thermal disturbance accompanying bundle erasing. The controller 1009 performs bundle erasing according to the operation flow of one of FIGS. 17(*a*) and 17(*b*). Hereinafter, each step in FIG. 17 will be described.

In the operation flow shown in FIG. 17(*a*), the controller 1009 performs bundle erasing of inflicting PCMCHAIN (A1). The controller 1009 reads a counter recording the number of times inflicted PCMCHAIN is subjected to a thermal disturbance caused by the bundle erasing (A2). If the counter is less than a predetermined value, the counter is incremented by 1 (A3) and if the counter is equal to or more than the predetermined value, a reset operation is performed again on a memory cell in a reset state inside inflicted PCMCHAIN (A4). Accordingly, a memory cell about to change to a set state with a decreasing resistance due to a thermal disturbance caused by the bundle erasing can be returned (refreshed) to a reset state. The controller 1009 sets the counter value to 0 (A5). The counter recording the number of times of disturbance can be stored in, for example, a memory inside the control region 1011 described with reference to FIG. 1 or a memory provided outside FIG. 1.

In the operation flow shown in FIG. 17(*b*), for example, the monitor cell shown in FIG. 16 is provided inside inflicted PCMCHAIN and refresh is performed when the state of the monitor cell is changed by a thermal disturbance. The monitor cell is put into a reset state in advance. The controller 1009 performs bundle erasing of inflicting PCMCHAIN (B1) and reads the state of the monitor cell (B2). If the monitor cell has changed to a set state, the controller 1009 performs a refresh operation on inflicted PCMCHAIN like in step A4 (B3) and performs a reset operation on the monitor cell (B4).

In the operation flow described with reference to FIG. 17, all memory cells in inflicted PCMCHAIN are refreshed, but if a memory cell whose state has changed due to a thermal disturbance can be identified, a refresh operation may be performed only on such a memory cell. More specifically, adding an ECC (error correction) bit to data to be able to identify an error location can be considered. In this case, though the number of cells needed to record data increases, an error can be corrected by data processing within a range in which a correction can be made by ECC code. Further, by identifying the bit position where an error has occurred, a memory cell affected by a thermal disturbance can be identified.

In addition to the above, if the resistivity of a memory cell is read and the resistivity of the cell in a reset state is found to have decreased to such a level immediately before being determined to be a set state, the state of the memory cell can also be refreshed by performing a reset operation on the memory cell.

The refresh operation described in this fifth embodiment may, as described with reference to FIG. 17, automatically be performed by the controller 1009 or a command instructing to perform a refresh operation may explicitly be provided and performed from outside the semiconductor memory device.

Sixth Embodiment

In the fifth embodiment, an operation example that prevents data erasing in which a cell in a reset state is changed to a set state by a thermal disturbance caused by repeatedly performing bundle erasing has been described. In the sixth embodiment of this invention, an operation example that prevents a data loss by a phenomenon in which conversely a memory cell in a set state is changed to a reset state will be described. In the sixth embodiment, like in the fifth embodiment, both of a disturbance caused by heat of the bundle erasing itself and, as described in the fourth embodiment, a thermal disturbance caused when a reset operation is again performed on a memory cell having been subject to a thermal disturbance are considered.

If crystallization of a phase change material during the transition to a set state is not sufficient, the resistance may increase after being subject to a thermal disturbance. To prevent the loss of data by such an operation, reading data of a region affected by the thermal disturbance and saving the data in another region can be considered. The configuration of a semiconductor memory device according to the sixth embodiment is the same as that in the fourth and fifth embodiments and thus, the description focuses on the operation to save data in another region.

Figure 18:
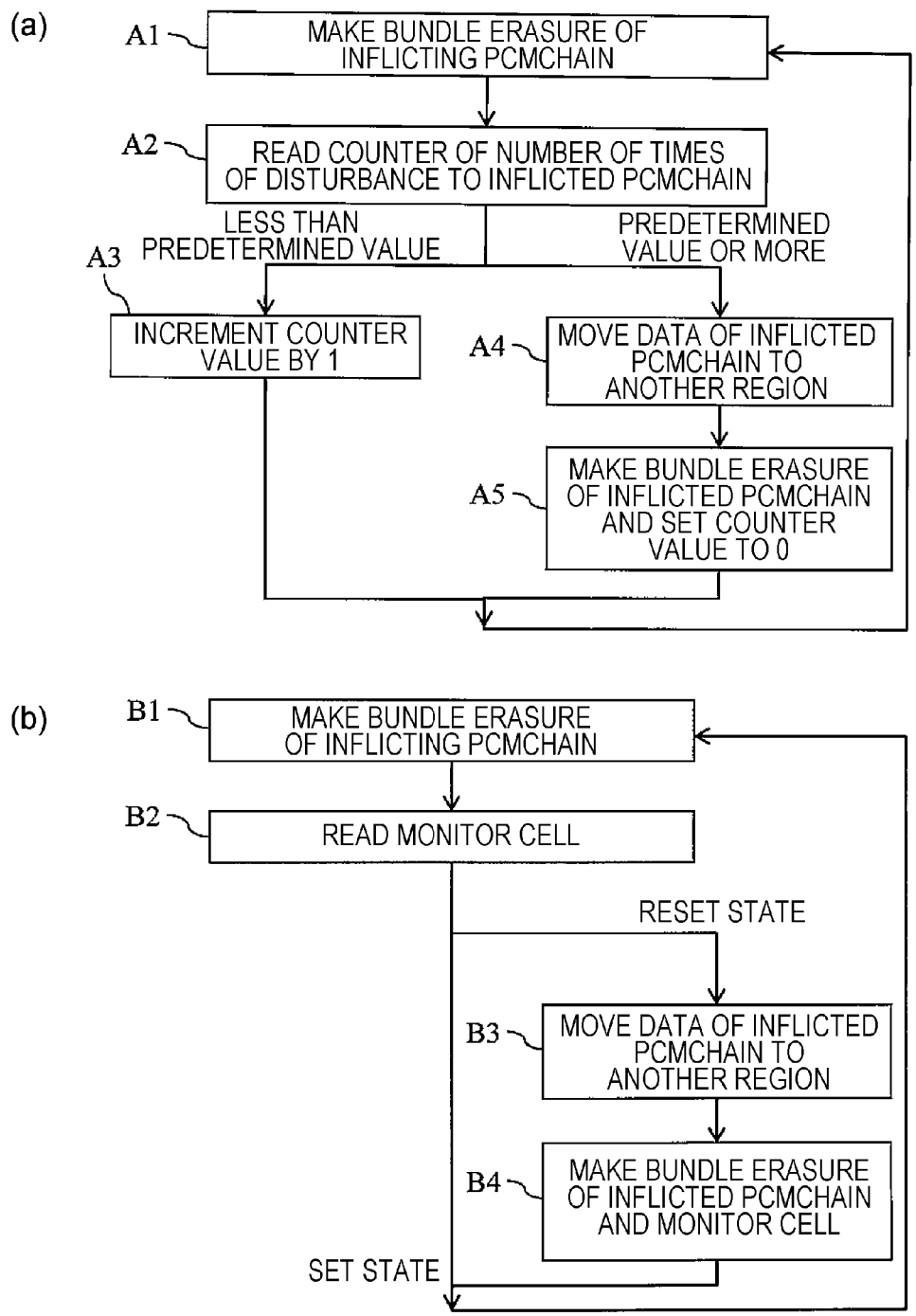
FIGS. 18(a) and 18(b) are operation flows when the semiconductor memory device according to a sixth embodiment performs the bundle erasing.

FIGS. 18(*a*) and 18(*b*) are operation flows when the semiconductor memory device according to the sixth embodiment performs bundle erasing. Here, FIGS. 18(*a*) and 18(*b*) are shown as two techniques to curb the influence of a thermal disturbance accompanying bundle erasing. The controller 1009 performs bundle erasing according to the operation flow of one of FIGS. 18(*a*) and 18(*b*). Hereinafter, each step in FIG. 18 will be described.

In the operation flow shown in FIG. 18(*a*), the controller 1009 performs bundle erasing of inflicting PCMCHAIN (A1). The controller 1009 reads a counter recording the number of times inflicted PCMCHAIN is subjected to a thermal disturbance caused by the bundle erasing (A2). If the counter is less than a predetermined value, the counter is incremented by 1 (A3). If the counter is equal to or more than the predetermined value, data inside inflicted PCMCHAIN is moved to another region (A4) and bundle erasing of inflicted PCMCHAIN is performed. The controller 1009 sets the counter value to 0 (A5). The counter recording the number of times of disturbance can be stored in, for example, a memory inside the control region 1011 described with reference to FIG. 1 or a memory provided outside FIG. 1.

In the operation flow shown in FIG. 18(*b*), like in FIG. 17(*b*), the monitor cell is used. The monitor cell is put into a set state in advance. The controller 1009 performs bundle erasing of inflicting PCMCHAIN (B1) and reads the state of the monitor cell (B2). If the monitor cell has changed to a reset state, the controller 1009 moves data inside inflicted PCMCHAIN to another region like in step A4 (B3) and performs bundle erasing of a region containing the monitor cell (B4). The monitor cell may be arranged in a location where a resistance increase phenomenon is most likely to occur after bundle erasing thereof being performed simultaneously with inflicted PCMCHAIN.

The data movement operation described in the sixth embodiment may, as described with reference to FIG. 18, automatically be performed by the controller 1009 or a command instructing to perform a data movement operation may explicitly be provided and performed from outside the semiconductor memory device.

Seventh Embodiment

In the seventh embodiment of this invention, some operation examples that take measures against thermal disturbance using the block as a logical unit in which access to data stored in a semiconductor memory device is accepted will be described. If not specifically mentioned, the configuration of the semiconductor memory device is the same as that in the first to sixth embodiments.

Seventh Embodiment

Bulk Erase Operation in the Block Unit

In the second embodiment, that the number of times of thermal disturbance can be reduced by performing a reset operation after performing bundle erasing in advance is described. A similar operation can also be performed by using the block. That is, an operation similar to that in the second embodiment can be performed by performing bulk erasing of data in a block including a plurality of neighboring bundle erase units and then sequentially programming data into the block. In this case, there is no need for measuring against thermal disturbance as described in the second to sixth embodiments for PCMCHAIN on individual bundle erase unit borders. Instead, similar measures may be taken on the border of blocks.

Seventh Embodiment

Number of Pages Contained in a Block

Each block contains one or more pages as an internal processing unit for data programming or data reading processing inside a semiconductor memory device. Data reading and data programming are performed in units of pages and data erasing is performed in units of blocks. If a plurality of pages is contained in a block, a page in which data that should not be erased is stored may be present in the block when an attempt is made to erase the block. In this case, before an erase operation is performed on the block, the page in which necessary data is stored needs to be moved to a page in another block. Such an operation is called a garbage collection and causes performance degradation of a semiconductor memory device. To prevent a garbage collection from occurring, it is preferable to configure a block as a single page. On the other hand, if throughput of the page read operation is considered, it is preferable to read a plurality of memory cells in a page with a degree of parallelism as high as possible. For a semiconductor memory device according to the first embodiment, each page is preferably connected to as many the electrode wires 3 as possible. This is because each of the electrode wires 3 can access only one memory cell simultaneously.

Seventh Embodiment

Number of Bundle Erase Units Contained in a Block

Figure 19:
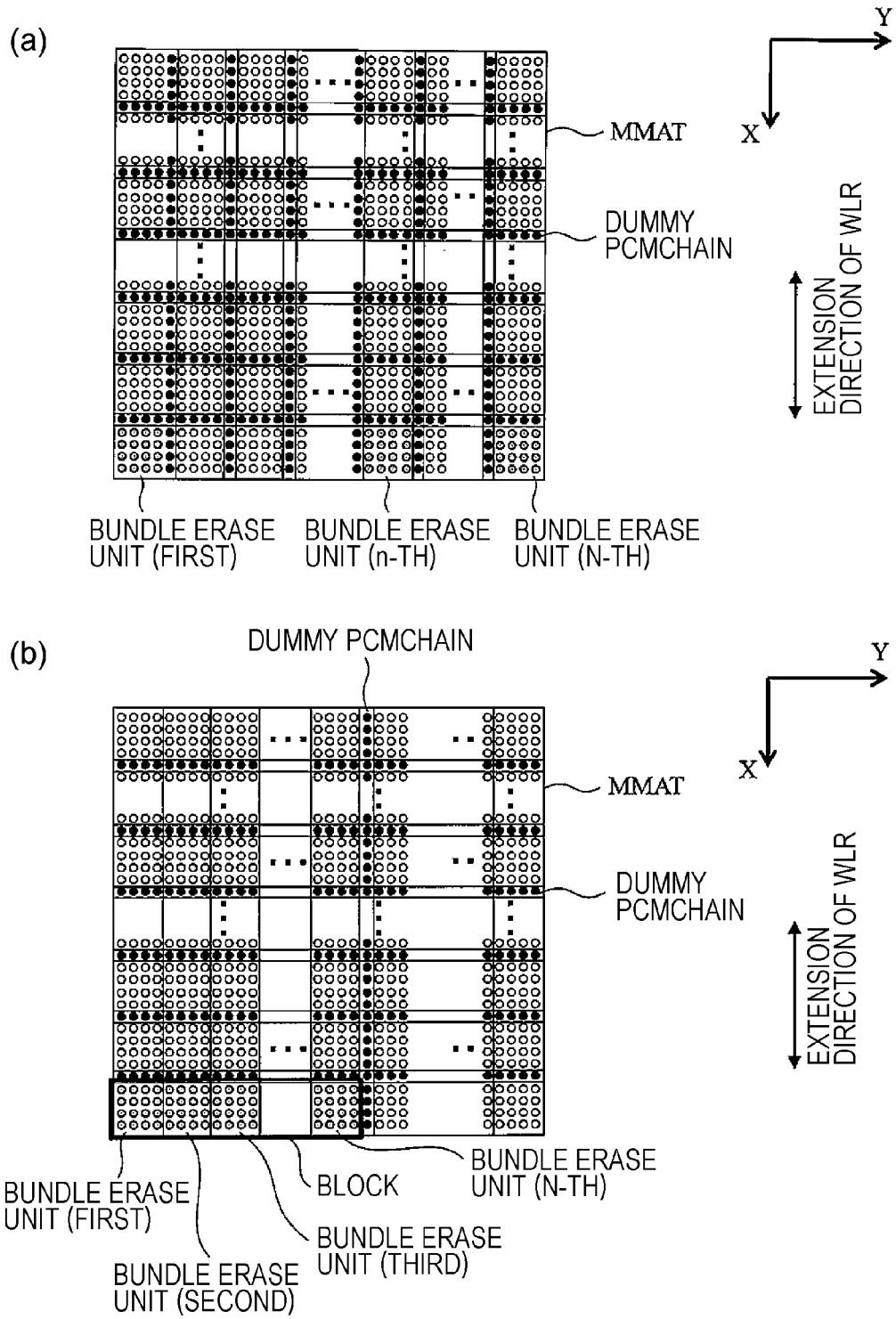
FIGS. 19(a) and 19(b) are top views illustrating the number of blocks contained in one bundle erase unit.

FIGS. 19(*a*) and 19(*b*) are top views illustrating the number bundle erase units contained in one block. Here, an example in which 4×4=16 neighboring PCMCHAIN are contained in the bundle erase unit, four in the X direction and four in the Y direction, is shown. As described above, when block erasing is performed, it is necessary to check whether a page holding data that should not be erased is contained in the block and thus, it is necessary to read all data in the block in advance. Therefore, the degree of parallelism when data is read from the block is desirably as high as possible.

FIG. 19(*a*) shows an example in which bundle erase units forming one block are randomly arranged in a memory matrix (MMAT). FIG. 19(*b*) shows an example in which the degree of parallelism of reading is increased by arranging a plurality of bundle erase units along the Y direction inside one block. When a semiconductor memory device according to the first embodiment is used, a read operation of a plurality of PCMCHAIN can be performed in parallel along the Y direction and thus, using this, the degree of parallelism when data is read from a block is increased. Incidentally, the efficiency of block erasing can also be enhanced by arranging a plurality of bundle erasing units in the X direction inside one block.

Seventh Embodiment

Measures Against Heat on the Block Border

If, as described above, a plurality of PCMCHAIN is arranged in the Y direction inside one block to increase the degree of parallelism when data is read from the block, more PCMCHAIN are arranged on the block border on the X direction end than on the block border on the Y direction end. Then, if measures against thermal disturbance are taken by arranging dummy cells on the X direction end to physically increase the distance between PCMCHAIN, an increase of the memory matrix (MMAT) area (that is, an increase of the bit cost) is conspicuous. On the other hand, PCMCHAIN on the block border on the X direction end can be read in parallel by the electrode wire 3 and thus, the operation described in the fourth and fifth embodiments can be performed in a short time. Therefore, it is more desirable to take measures against thermal disturbance by the operation described in the fourth and fifth embodiments than to take measures against thermal disturbance by physically increasing the distance between PCMCHAIN using dummy cells or the like.

On the other hand, the number of PCMCHAIN on the block border on the Y direction end is smaller than on the block border on the X direction end and thus, even if measures against thermal disturbance are taken by arranging dummy cells or the like to physically increase the distance between PCMCHAIN, an increase of the memory matrix (MMAT) area (that is, an increase of the cost bit) is slight. On the other hand, PCMCHAIN on the block border on the Y direction end cannot be read in parallel by the electrode wire 3 and thus, the operation described in the fourth and fifth embodiments cannot be performed in a short time. Therefore, it is more desirable to take measures against thermal disturbance by physically increasing the distance between PCMCHAIN using dummy cells or the like.

Seventh Embodiment

Tradeoff of the Number of Pages Contained in a Block

Figure 20:
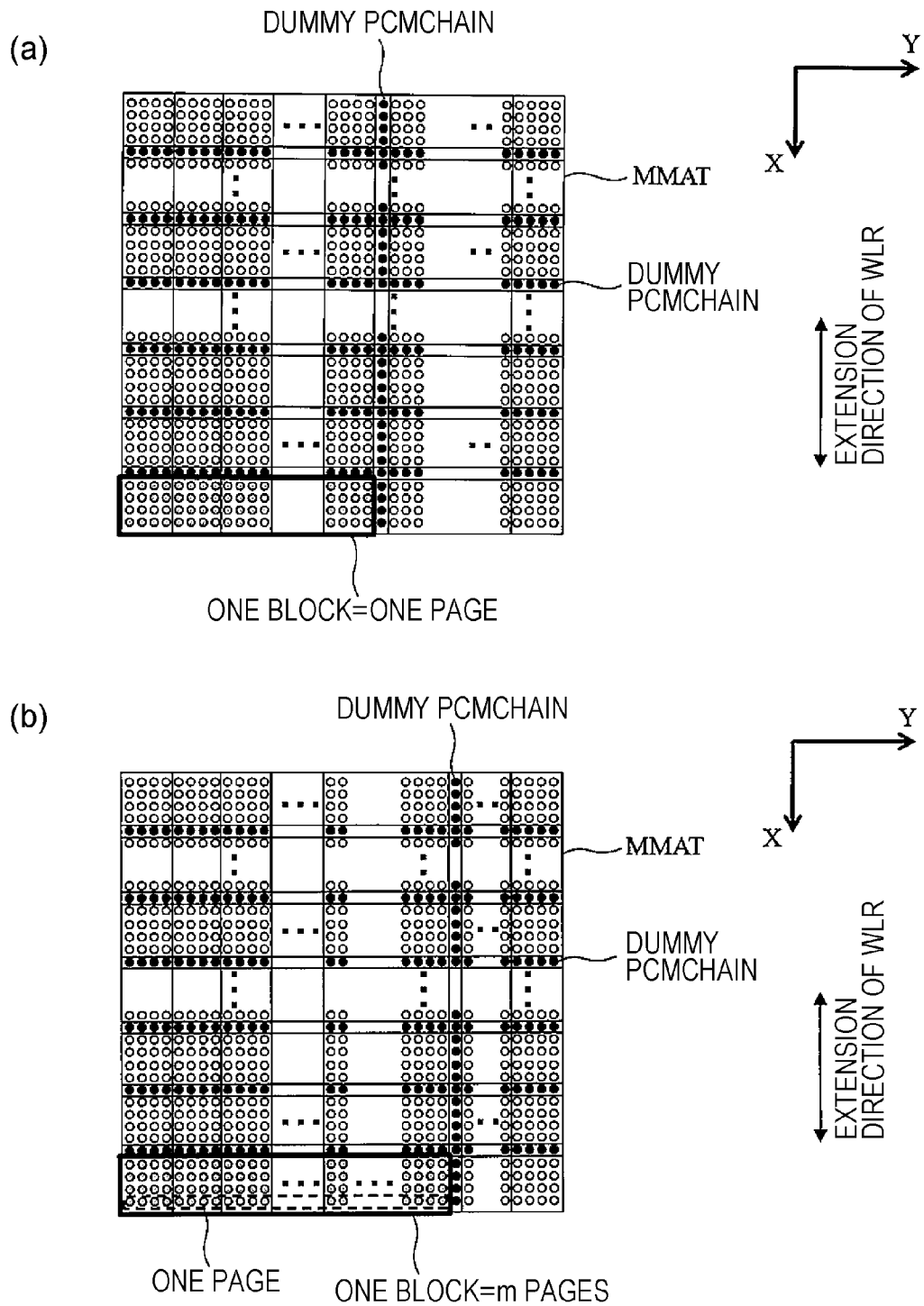
FIGS. 20(a) and 20(b) are diagrams illustrating trade-offs of the number of pages contained in a block.

FIGS. 20(a) and 20(b) are diagrams illustrating trade-offs of the number of pages contained in a block. When only one page is contained in a block as shown in FIG. 20(a), the garbage collection can be eliminated, but a plurality of read operations is needed to read data from one page. This is because the bundle erase unit contains a plurality of PCMCHAIN in the X direction.

FIG. 20(b) shows an example in which a plurality of pages is contained in one block, a plurality of PCMCHAIN is contained in each page along the Y direction, and one PCMCHAIN is contained along the X direction. Accordingly, all memory cells in the same page can be read in parallel by each of which being connected to the electrode wires 3. In this case, the garbage collection occurs, but one page can be read by one read operation so that the page read throughput is high.

Figure 21:
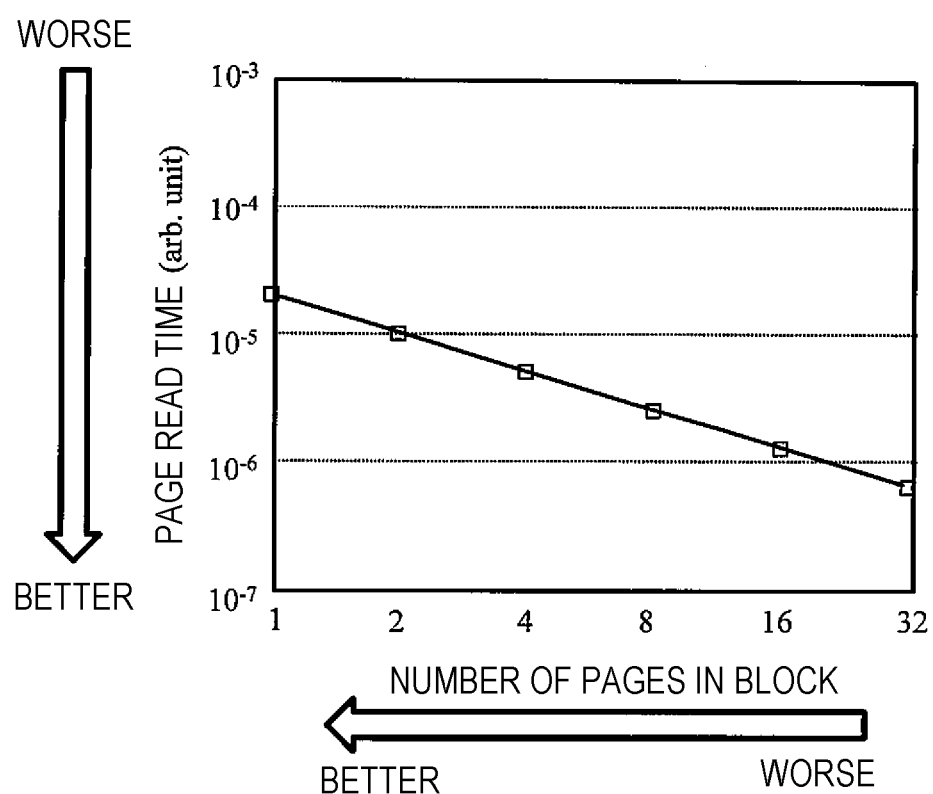
FIG. 21 is a diagram showing a relationship between a block size and a page read time.

FIG. 21 is a diagram showing a relationship between a block size and a page read time. Here, an example in which a total of 16 PCMCHAIN, four in the X direction and four in the Y direction, are contained in the bundle erase unit and eight memory cells are contained in the Z direction inside PCMCHAIN is shown. As shown in FIG. 21, the read performance tends to deteriorate with an increasing number of pages contained in the block. Thus, it is desirable to change the number of pages contained in one block in accordance with the data type, for example, whether data needs to be frequently programmed/erased or data is only read.

The controller 1009 can determine the number of pages contained in one block, the number and arrangement of PCMCHAIN contained in the bundle erase unit, and the arrangement of dummy PCMCHAIN. Thus, the configuration thereof can dynamically be changed by explicitly providing a command instructing the configuration thereof from outside the semiconductor memory device.

Eighth Embodiment

In the second embodiment, suppressing the number of times of being subject to a thermal disturbance by performing bundle erasing and then performing a reset operation sequentially along each direction has been described. A similar operation can also be performed in the relationship between the block and pages. That is, if one block contains a plurality of pages, it is effective to determine the order of page programming in the block in advance to suppress thermal disturbance for other pages in the block caused by a reset operation on pages. In the eighth embodiment of this invention, an operation example thereof will be described. The other configuration of the semiconductor memory device is the same as that in the first to seventh embodiments.

FIGS. 22(a) and 22(b) are diagrams illustrating a block erase operation in the eighth embodiment. When block erasing is performed, after all cells in the block are set to a set state by bundle erasing or the like (bulk erasing), each page is programmed (reset operation). At this point, page programming is performed, as shown in FIG. 22(a), in the order from the first page to the second and third pages along the X direction. When the X direction end is reached, similar programming is performed after moving one step in the Y direction. Further, as shown in FIG. 22(b), programming is performed in the order from the first page for memory cells adjacent in the Z direction.

Figure 22:
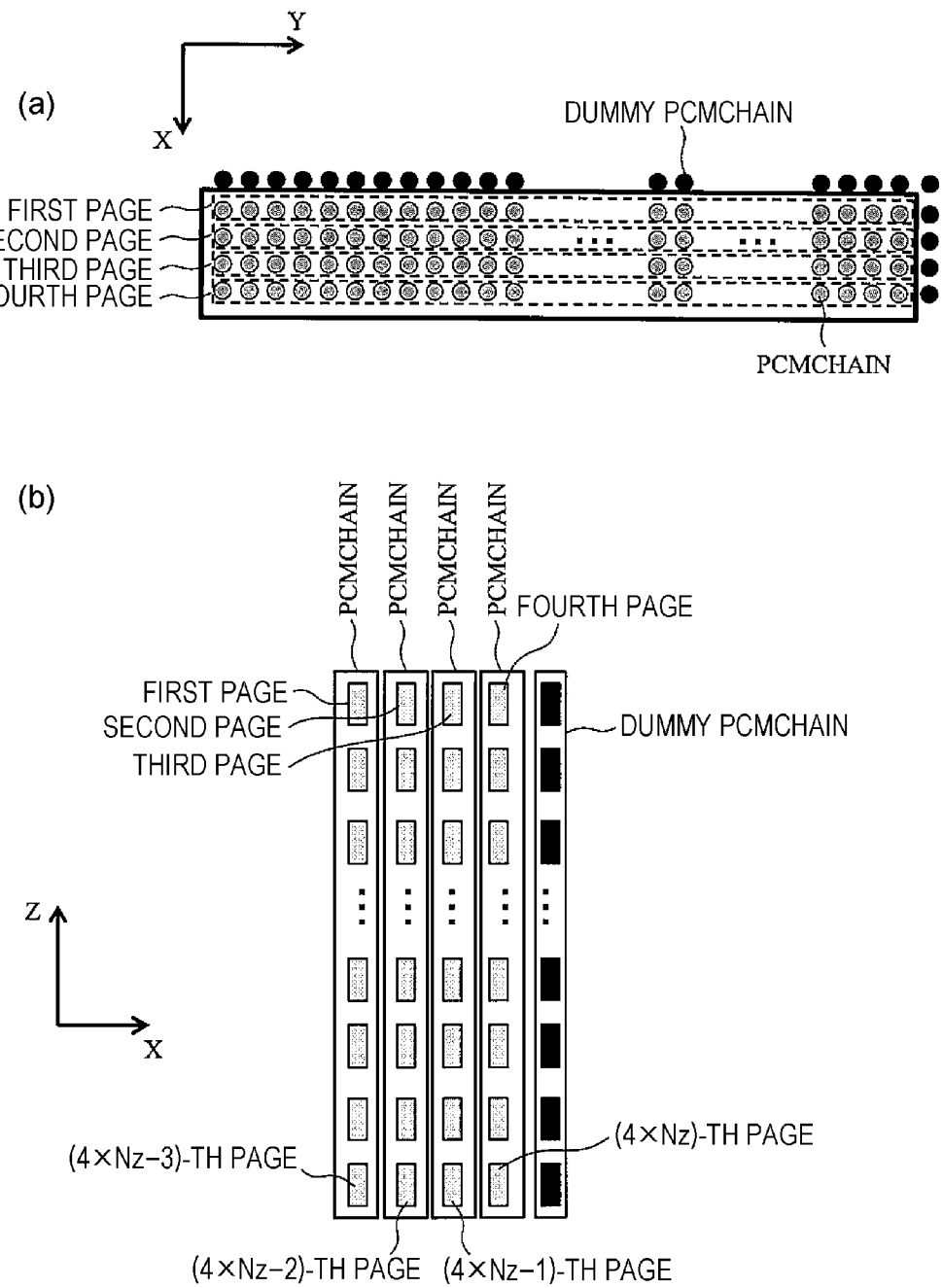
FIGS. 22(a) and 22(b) are diagrams illustrating a block erase operation in an eighth embodiment.

By determining the programming order as shown in FIG. 22, the thermal disturbance by a reset operation on one page occurs a total of only three times, once from the page adjacent in each direction. When the programming order is not specified, by contrast, a thermal disturbance occurs six times in total, once from pages on both sides in each direction. Therefore, when a reset operation is performed on pages contained in the block, it is useful to sequentially program along each direction after performing bulk erasing in advance.

Ninth Embodiment

An operation to suppress the number of times of being subject to a thermal disturbance can also be performed in block erasing. If the block erasing is randomly performed, a case of a total of four million times of being subject to thermal disturbance, one million times for each of blocks on both sides adjacent in the X direction and one million times for each of blocks on both sides adjacent in the Y direction, may maximally be caused by, for example, one million times of block erase operation. Thus, in the ninth embodiment of this invention, an operation example of suppressing the number of times of being subject to thermal disturbance by the block erasing will be described. The other configuration of the semiconductor memory device is the same as that in the first to eighth embodiments.

Figure 23:
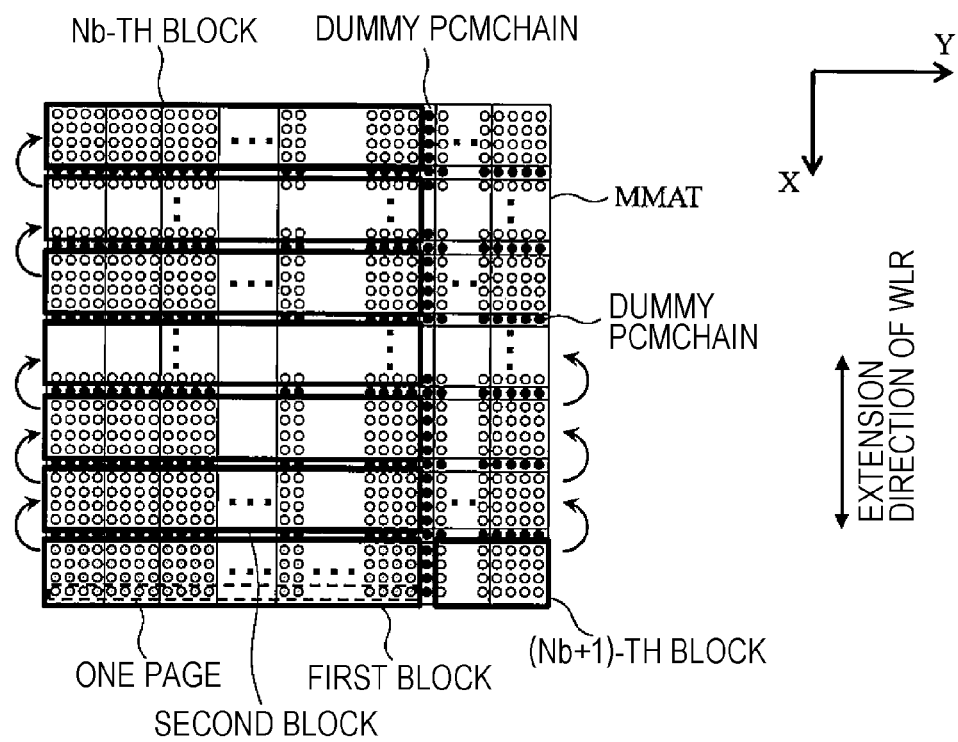
FIG. 23 is a diagram illustrating the block erase operation in a ninth embodiment.

FIG. 23 is a diagram illustrating the block erase operation in the ninth embodiment. In the ninth embodiment, block erasing is performed in ascending order of coordinates along the XY directions. Accordingly, the thermal disturbance during block erasing can be limited to a total of two times, once from one side in each direction. This is because each block is erased before being subject to the second block erasing disturbance from neighboring blocks in each of the XY directions and data is updated.

This invention is not limited to the above embodiments and contains various modifications. The embodiments have been described in detail to facilitate an understanding of this invention and this invention is not necessarily limited to embodiments including all described configurations. A portion of the configuration of some embodiment can be replaced by the configuration of another embodiment. Also, the configuration of some embodiment can be added to the configuration of another embodiment. Also, additions, deletions, or substitutions of a portion of the configuration of each embodiment by another configuration can be made.

REFERENCE SIGNS LIST

1001 I/O interface
1002 memory cell array
1003, 1004, 1005, 1006 voltage source
1007 voltage selector
1008 wire selector
1009 controller
1010 read unit
1011 control region
21p, 22p, 23p, 24p gate polysilicon layer
3 electrode
7 phase change material layer
8p, 50p, 51p channel semiconductor layer
9, 20 gate insulator film
40p, 41p, 42p N type semiconductor layer
11, 12, 13, 14, 15 insulator film layer
91 insulator film layer
STTrX X select transistor
STTrY Y select transistor
STTGX X select transistor gate
STTGY Y select transistor gate
STTGXC contact to STTGX
STTGYC contact to STTGY
STTGXL power feeding wire to STTGX
STTGYL power feeding wire to STTGY
STTGXLC contact to STTGX
STTGYLC contact to STTGY
WLC contact connecting WLPLATE and peripheral circuit
BLC contact connecting BLPLATE and peripheral circuit
GL1, GL2, GL3, GL4 terminal to feed power to gate
STXm−1, STXm, STXm select transistor gate
STYn−2, STYn−1, STYn, STYn+1, STYn+2 select transistor gate
BLPLATE upper electrode
WLR, WLRn−1, WLRn, WLRn+1 word line for read operation
WLPLATE lower electrode
Nz number of cells connected in the Z direction of PCM-CHAIN
MMAT memory matrix

The invention claimed is:
1. A semiconductor memory device, comprising:
a lower electrode in a flat plate shape and an upper electrode in the flat plate shape;
a plurality of first select transistors arranged between the lower electrode and the upper electrode, extending in a first direction, and provided along a second direction different from the first direction;
a plurality of wires connected to the lower electrode via the plurality of first select transistors and each paired with a corresponding one of the plurality of first select transistors;
a plurality of second select transistors arranged between the plurality of wires and the upper electrode, extending in the second direction, and provided along the first direction; and
a plurality of memory chains having one or more memory cells connected in series in a normal direction to the lower electrode and the upper electrode, each memory chain provided along the first direction and the second direction, wherein the wire and the lower electrode are configured to be electrically insulated from each other by turning off the first select transistor.

2. The semiconductor memory device according to claim 1,
wherein the semiconductor memory device includes a control circuit that supplies a voltage to the plurality of first select transistors, the plurality of second select transistors, the lower electrode, and the upper electrode and a sensor that detects a current flowing through the wire, and when information stored in a memory cell is read, the control circuit turns off the first select transistor and turns on the second select transistor corresponding to the one or more memory chains containing said memory cell from which the information is to be read and then reads the information stored in the memory cell contained in the one or more memory chains in parallel by detecting the current flowing between the wire and the upper electrode via the one or more memory chains containing the memory cell from which the information is to be read by the sensor.

3. The semiconductor memory device according to claim 1,
wherein when bulk erasing of information stored in all the memory cells contained in the memory chain is performed, the control circuit performs the bulk erasing of the information stored in all the memory cells contained in the one or more memory chains along the first direction and in all the memory cells contained in the one or more memory chains along the second direction by passing a current between the upper electrode and the lower electrode via the memory chain after turning on the one or more first select transistors and the one or more second select transistors corresponding to the memory chain from which the information is to be erased.

4. The semiconductor memory device according to claim 3,
wherein each said memory cell is formed by connecting in parallel cell transistors driven by a phase change element and the control circuit and when a result of the bulk erasing is checked, the control circuit turns off the cell transistors of all the memory cells in the memory chain for which the bulk erasing has been performed, further turns off the first select transistor corresponding to the memory chain for which the bulk erasing has been performed, and also turns on the second select transistor corresponding to the memory chain for which the bulk erasing has been performed and then determines whether all the phase change elements in the memory chain for which the bulk erasing has been performed are set to a low-resistance state by detecting by the sensor the current flowing between the wire and the upper electrode via the memory chain for which the bulk erasing has been performed, thereby checking the result of the bulk erasing.

5. The semiconductor memory device according to claim 1,
wherein when information is programmed into the memory cells, the control circuit turns on one said first select transistor and one said second select transistor which correspond to the one or more memory chains containing the memory cells into which the information is to be programmed and then programs the information into the memory cells contained in the one or more memory chains in parallel by passing a current between the upper electrode and the lower electrode via the memory chains.

6. The semiconductor memory device according to claim 1,
wherein the second select transistor is arranged between the cell chain and the upper electrode, a channel of each said second select transistor has a recess depressed in the normal direction in an interval portion between the memory chains adjacent along the second direction, and a path length of a leak current flowing between the memory chains adjacent along the second direction through the recess is configured to be a minimum distance capable of securing a withstand voltage between a source and a drain of the second select transistor.

7. A semiconductor memory device, comprising:
a plurality of memory chains having one or more memory cells connected in series in a normal direction to a substrate and provided along a first direction and a second direction parallel to the substrate;
a first selector that selects one of the memory chains in the first direction; a second selector that selects one of the memory chains in the second direction; and
a control circuit that controls the first selector and the second selector to program the information into the memory cell or to read the information from the memory cell,
wherein the memory cell is formed by connecting in parallel a cell transistor and a phase change element and when the one or more memory chains adjacent along the first direction and the one or more memory chains adjacent along the second direction are selected and bulk erasing of information stored in all the selected memory chains is performed, the control circuit supplies a smaller current to the memory chain arranged in a center portion of a region containing each of the selected memory chains than a current to the memory chain arranged in a peripheral portion of the center portion and also makes a time of supplying the current shorter so that Joule heat generated by the current on the phase change element is smaller in the center portion than in the peripheral portion.

8. The semiconductor memory device according to claim 7,
wherein the semiconductor memory device includes a dummy chain into which information is not programmed or from which information is not read by the control circuit, or has a wide portion where an interval between the memory chains in at least one of the first direction and the second direction is wider than the interval between the other memory chains.

9. The semiconductor memory device according to claim 7,
wherein the control circuit reads and saves the information from the memory cells in the other memory chain arranged in a periphery of the memory chain for which the bulk erasing is to be performed before the bulk erasing being performed, and after the bulk erasing being performed, programs the saved information back into the memory cells in the other memory chain arranged in the periphery or after the bulk erasing being performed, reads the information from the memory cells in the other memory chain arranged in the periphery and compares with the saved information and only if both are different, programs the saved information back into the memory cells in the other memory chain arranged in the periphery.

10. The semiconductor memory device according to claim 7,
wherein the control circuit reads and saves the information from the memory cells in the other memory chain arranged in a periphery of the memory chain for which the bulk erasing is to be performed at the time before the bulk erasing being performed a predetermined number of times and after the bulk erasing being performed the predetermined number of times, programs the saved information back into the memory cells in the other memory chain arranged in the periphery or moves the saved information to a different region, or reads and saves the information from the memory cells in the other memory chain arranged in a periphery of the memory chain for which the bulk erasing is to be performed before the bulk erasing being performed and when a change of the information stored in the memory cells in the other memory chain arranged in the periphery by the bulk erasing is verified, programs the saved information back into the memory cells in the other memory chain arranged in the periphery or moves the saved information to a different region.

11. The semiconductor memory device according to claim 2,
wherein when bulk erasing of the information stored in a block serving as a logical unit to accept access to the information stored in the semiconductor memory device and configured by the plurality of memory chains is performed, the control circuit reads and saves the information in parallel from the memory chains arranged adjacent along the second direction of the memory chains contained in the block for which the bulk erasing is to be performed before the bulk erasing of the block being performed, and after the bulk erasing being performed, programs the saved information back into the memory cells of the other memory chain arranged in the periphery.

12. The semiconductor memory device according to claim 11,
wherein the semiconductor memory device includes a dummy chain into which the information is not programmed or from which the information is not read by the control circuit, or has a wide portion where an interval between the memory chains is wider than the interval between the other memory chains, and the dummy chain or the wide portion is provided between memory chains adjacent along the second direction.

13. The semiconductor memory device according to claim 11,
wherein the control circuit matches the block as the logical unit to accept the access to the information stored in the semiconductor memory device and a page as an internal processing unit to store the information in the semiconductor memory device, or configures the block using a plurality of the pages and also configures the page using the one or more memory chains adjacent in the second direction.

14. The semiconductor memory device according to claim 13,
wherein the control circuit accepts a command instructing at least one of an arrangement of the memory chains for which the bulk erasing is to be performed, the arrangement of the memory chains constituting the block and the page, and the arrangement of the dummy chains and uses the memory chains according to the command.

15. The semiconductor memory device according to claim 13,
wherein the control circuit starts, when the information is programmed into the page, to program from the page arranged on an end in the first direction or on the end in the second direction of the pages constituting the block to sequentially program the information along the first direction or the second direction into the pages adjacent along the first direction or the second direction, and when the bulk erasing of the block is performed, starts the bulk erasing from the block arranged on the end in the first direction or on the end in the second direction to sequentially perform the bulk erasing along the first direction or the second direction of the blocks adjacent along the first direction or the second direction.

* * * * *